(12) United States Patent
Chang et al.

(10) Patent No.: US 11,699,888 B2
(45) Date of Patent: Jul. 11, 2023

(54) POWER ADAPTER ASSEMBLY STRUCTURE

(71) Applicant: Delta Electronics, Inc., Taoyuan (TW)

(72) Inventors: Li-Yen Chang, Taoyuan (TW);
Chin-Chu Huang, Taoyuan (TW);
Ying-Shu Tseng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 56 days.

(21) Appl. No.: 17/551,433

(22) Filed: Dec. 15, 2021

(65) Prior Publication Data

US 2023/0111573 A1    Apr. 13, 2023

(30) Foreign Application Priority Data

Oct. 13, 2021    (CN) .......................... 202111192519.0

(51) Int. Cl.

| H01R 31/06 | (2006.01) |
| H01R 12/71 | (2011.01) |
| H05K 5/00 | (2006.01) |
| H01R 12/70 | (2011.01) |
| H01R 13/24 | (2006.01) |

(52) U.S. Cl.
CPC ......... *H01R 31/06* (2013.01); *H01R 12/7088* (2013.01); *H01R 12/714* (2013.01); *H05K 5/0069* (2013.01); *H01R 13/24* (2013.01)

(58) Field of Classification Search
CPC .. H01R 12/7088; H01R 12/714; H01R 31/06; H01R 13/24; H05K 5/0069
See application file for complete search history.

(56) References Cited

U.S. PATENT DOCUMENTS

| 6,893,300 | B2 | 5/2005 | Zhou | |
| 7,281,954 | B1 | 10/2007 | Hashiguchi | |
| 8,303,317 | B1 | 11/2012 | Gao et al. | |
| 9,537,276 | B1 * | 1/2017 | Cai | ........................ H01R 31/06 |
| 9,825,415 | B1 * | 11/2017 | Lin | ........................ H01R 24/68 |
| 2007/0217631 | A1 | 9/2007 | Ho | |

(Continued)

FOREIGN PATENT DOCUMENTS

| CN | 2838098 Y | 11/2006 |
| CN | 204304027 U | 4/2015 |
| CN | 204706684 U | 10/2015 |

(Continued)

*Primary Examiner* — Briggitte R. Hammond
(74) *Attorney, Agent, or Firm* — Kirton McConkie; Evan R. Witt

(57) ABSTRACT

A power adapter assembly structure is disclosed and includes a housing, a circuit board, a socket and an elastic element. The circuit board including a first abutting surface and the socket including a second abutting surface are fastened in the housing. The elastic element connected between the circuit board and the socket includes a main body, a first hanging arm and a second hanging arm. The first hanging arm and the second hanging arm are disposed at two opposite ends of the main body, and constantly abuts the first abutting surface and the second abutting surface, respectively. A first gap is formed between the main body and the first abutting surface, and less than a first length of the first hanging arm. A second gap is formed between the main body and the second abutting surface, and less than a second length of the second hanging arm.

19 Claims, 22 Drawing Sheets

(56) References Cited

U.S. PATENT DOCUMENTS

2012/0208379 A1  8/2012  Lai
2017/0365947 A1  12/2017  Costello et al.

FOREIGN PATENT DOCUMENTS

| | | |
|---|---|---|
| CN | 206313675 U | 7/2017 |
| CN | 207183692 U | 4/2018 |
| CN | 112467451 A | 3/2021 |
| CN | 213989296 U | 8/2021 |
| JP | S5982980 U | 6/1984 |
| TW | M327111 U | 2/2008 |
| TW | 201544133 A | 12/2015 |
| TW | I674716 B | 10/2019 |
| TW | M609430 U | 3/2021 |

* cited by examiner

POWER ADAPTER ASSEMBLY STRUCTURE

FIELD OF THE INVENTION

The present disclosure relates to a power device, and more particularly to a power adapter assembly structure for simplifying the assembling procedure, realizing the automatic production, and avoiding the electrical interference at the same time.

BACKGROUND OF THE INVENTION

In current daily life, power conversion modules are required to provide the power for many electronic device applications. The power conversion module mainly includes a combination of a socket and a circuit board. The socket is used to connect to the conductive plug of the power supply, and the circuit board is connected to the socket. In that, the power conversion modules are configured to convert electrical energy and provide the required power to the electronic devices. Moreover, in the power conversion modules, the socket and the circuit board are connected through the leading wires.

Since the leading wires have to be welded manually after the socket and the circuit board are assembled, the conventional power conversion assembly structure is not conducive to the realization of the automated production. On the other hand, it is not easy to control the length change and direction of the wire connection. Furthermore, it is easy to cause the electrical electromagnetic interference (EMI) or the radio frequency interference (RFI) due to the crossing of the leading wires.

Therefore, there is a need of providing a power adapter assembly structure to simplify the assembling procedure of the socket and the circuit board, realize the automatic production, avoid the EMI/RFI due to the crossed leading wires, and obviate the drawbacks encountered by the prior arts.

SUMMARY OF THE INVENTION

An object of the present disclosure is to provide a power adapter assembly structure. By utilizing the elastic element to connect the socket and the circuit board, the assembling procedure is simplified, the automated production is realized, and the EMI/RFI caused by the crossed leading wires is avoided at the same time.

Another object of the present disclosure is to provide a power adapter assembly structure. With one-piece formed elastic element disposed on an installation surface of the housing, when the socket and the circuit board are fastened on the housing, the two hanging arms of the elastic element constantly abut the abutting surfaces of the socket and the circuit board, respectively, so that a stable electronical connection of the socket and the circuit board is achieved. When the elastic element is pressed against the corresponding abutting surface constantly through the hanging arm thereof, the included angle between the hanging arm and the main body is for example an acute angle, so as to provide the elastic force and increase the structural strength. Since the hanging arms of the elastic element are pressed to constantly abut the corresponding abutting surfaces by the elastic force generated during fastening the socket and the circuit board to the housing, the assembling procedure of the socket, the circuit board and the housing is combined to realize the assembly structure of the housing, the socket, the circuit board and the elastic element by the automatic assembling equipment, and ensure the electrical connection between the socket and the circuit board.

A further object of the present disclosure is to provide a power adapter assembly structure. The elastic elements are configured to form the electrical connections between the socket and the circuit board, which are for example connected to the live wire, the neutral wire and the earth wire. Two elastic elements connected to the live wire and the neutral wire are led out from the rear side of the socket and arranged in parallel, so as to ensure that the minimum distance maintained between the two elastic elements meets the safety requirements for electrical clearance and creepage distance. In addition, the elastic element connected to the earth wire is led out from the lateral side of the socket to further ensure that the three elastic elements meet the safety requirements of electrical clearance and creepage distance. It avoids electrical EMI/RFI interference caused by crossed wires. On the other hand, since the electrical connections between the socket and the circuit board are realized through the elastic elements with structural strength, and integrated with the assembling procedure of the socket and the circuit board, it is more helpful to realize the assembly structure of the socket, the circuit board and the elastic elements by an automated production method. The assembling procedure is simplified, the production cost is reduced, and the competitiveness of the product is enhanced.

In accordance with an aspect of the present disclosure, a power adapter assembly structure is provided and includes a housing, a circuit board, a socket and at least one elastic element. The housing includes an installation surface. The circuit board is fastened in the housing and includes at least one first abutting surface facing the installation surface. The socket is fastened in the housing, disposed adjacent to the circuit board, and includes at least one second abutting surface. The at least one elastic element is disposed on the installation surface, connected between the circuit board and the socket, and includes a main body, a first hanging arm and a second hanging arm, wherein the first hanging arm and the second hanging arm are disposed at two opposite ends of the main body, the first hanging arm spatially corresponds to and constantly abuts the at least one first abutting surface, and the second hanging arm spatially corresponds to and constantly abuts the at least one second abutting surface, wherein a first gap is formed between the main body and the at least one first abutting surface, and the first gap is less than a first length of the first hanging arm extended from the main body, wherein a second gap is formed between the main body and the at least one second abutting surface, and the second gap is less than a second length of the second hanging arm extended from the main body.

In an embodiment, the at least one first abutting surface includes a first live-wire abutting surface and a first neutral-wire abutting surface located on a bottom surface of the circuit board, the at least one second abutting surface includes a second live-wire abutting surface and a second neutral-wire abutting surface located on a bottom side of the socket, and the at least one elastic element includes a first elastic element and a second elastic element, wherein the first hanging arm of the first elastic element constantly abuts against the first live-wire abutting surface, the first hanging arm of the second elastic element constantly abuts the first neutral-wire abutting surface, the second hanging arm of the first elastic element constantly abuts the second live-wire abutting surface, and the second hanging arm of the second elastic element constantly abuts against the second neutral-wire abutting surface.

In an embodiment, the main body of the first elastic element and the main body of the second elastic element are attached to the installation surface, respectively.

In an embodiment, the first elastic element and the second elastic element are arranged parallel to each other.

In an embodiment, the first live-wire abutting surface and the first neutral-wire abutting surface are located adjacent to a rear side of the socket, respectively.

In an embodiment, the at least one first abutting surface further includes a first earth-wire abutting surface located on the bottom surface of the circuit board, the at least one second abutting surface further includes a second earth-wire abutting surface located on the bottom side of the socket, and the at least one elastic element further includes a third elastic element, wherein the first hanging arm of the third elastic element constantly abuts against the first earth-wire abutting surface, and the second hanging arm of the third elastic element constantly abuts against the second earth-wire abutting surface.

In an embodiment, the first live-wire abutting surface and the first neutral-wire abutting surface are located adjacent to a rear side of the socket, respectively, and the first earth-wire abutting surface is located adjacent to a lateral side of the socket.

In an embodiment, each of the second live-wire abutting surface, the second neutral-wire abutting surface and the second earth-wire abutting surface is formed by a conductive metal sheet extended from a rear side of the socket to the bottom side, wherein the socket further includes three conductive pins extended from the rear side to a front side opposite to the rear side, and the second live-wire abutting surface, the second neutral-wire abutting surface and the second earth-wire abutting surface are electrically connected to the three conductive pins, respectively.

In an embodiment, the main body includes a fitting section and a standing section, the fitting section spatially corresponds to the at least one first abutting surface and is attached to the installation surface, and the standing section spatially corresponds to the at least one second abutting surface, wherein the fitting section is connected to the standing section, the first hanging arm and the standing section are located at two opposite ends of the fitting section, respectively, and the second hanging arm and the fitting section are located at two opposite ends of the standing section, respectively.

In an embodiment, the at least one first abutting surface includes a first live-wire abutting surface and a first neutral-wire abutting surface located on a bottom surface of the circuit board, the at least one second abutting surface includes a second live-wire abutting surface and a second neutral-wire abutting surface located on a rear side of the socket, and the at least one elastic element includes a first elastic element and a second elastic element, wherein the first hanging arm of the first elastic element constantly abuts against the first live-wire abutting surface, the first hanging arm of the second elastic element constantly abuts the first neutral-wire abutting surface, the second hanging arm of the first elastic element constantly abuts the second live-wire abutting surface, and the second hanging arm of the second elastic element constantly abuts against the second neutral-wire abutting surface.

In an embodiment, the socket further includes a first receiving slot and a second receiving slot disposed on the rear side of the socket, wherein the second live-wire abutting surface, and the second hanging arm and the standing section of the main body of the first elastic element are partially received within the first receiving slot, wherein the second neutral-wire abutting surface, and the second hanging arm and the standing section of the main body of the second elastic element are partially received within the second receiving slot.

In an embodiment, the first elastic element and the second elastic element are arranged parallel to each other.

In an embodiment, the first live-wire abutting surface and the first neutral-wire abutting surface are located adjacent to the rear side of the socket, respectively.

In an embodiment, the at least one first abutting surface further includes a first earth-wire abutting surface located on the bottom surface of the circuit board, the at least one second abutting surface further includes a second earth-wire abutting surface located on the bottom side of the socket, and the at least one elastic element further includes a third elastic element, wherein the first hanging arm of the third elastic element constantly abuts against the first earth-wire abutting surface, and the second hanging arm of the third elastic element constantly abuts against the second earth-wire abutting surface.

In an embodiment, the first live-wire abutting surface and the first neutral-wire abutting surface are located adjacent to the rear side of the socket, respectively, and the first earth-wire abutting surface is located adjacent to a lateral side of the socket.

In an embodiment, each of the second live-wire abutting surface, the second neutral-wire abutting surface and the second earth-wire abutting surface is formed by a conductive metal sheet extended from a rear side of the socket to the bottom side, wherein the socket further includes three conductive pins extended from the rear side to a front side opposite to the rear side, and the second live-wire abutting surface, the second neutral-wire abutting surface and the second earth-wire abutting surface are electrically connected to the three conductive pins, respectively.

In an embodiment, the first hanging arm and the main body form a first included angle, the second hanging arm and the main body form a second included angle, and each of the first included angle and the second included angle is an acute angle.

In an embodiment, the first hanging arm further includes a first extension section extended from the corresponding one of the at least first abutting surface toward the main body, and the second hanging arm further includes a second extension section extended from the corresponding one of the at least second abutting surface toward the main body.

In an embodiment, the first hanging arm and the second hanging arm are in a wavy bent shape.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
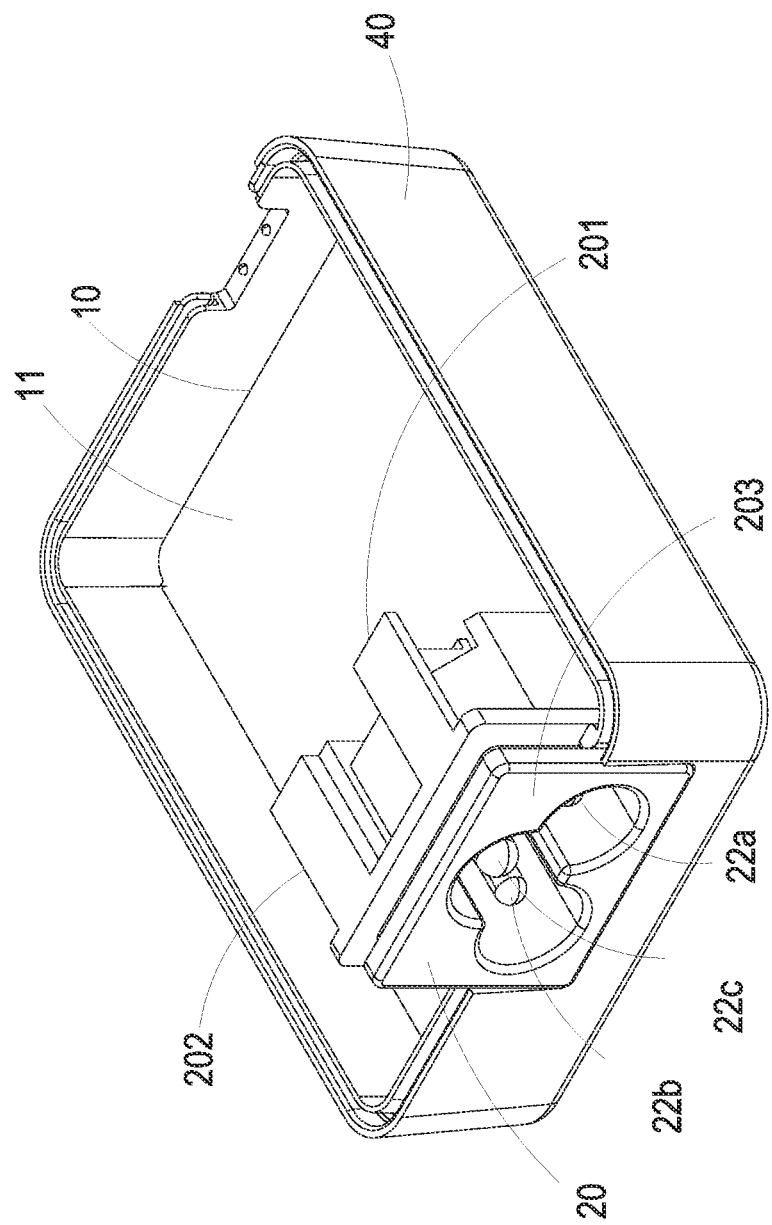
FIG. 1 is a perspective view illustrating a power adapter assembly structure according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
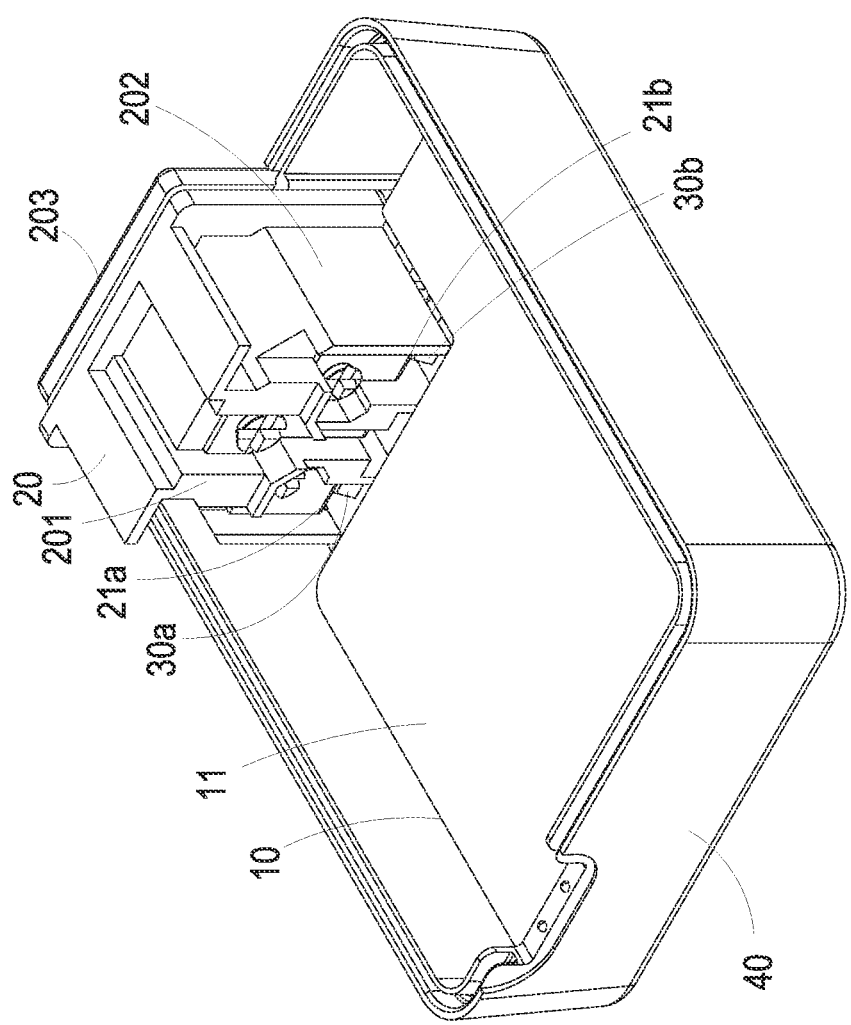
FIG. 2 is a perspective view illustrating the power adapter assembly structure according to the first embodiment of the present disclosure and taken from another perspective.
Figure 3:
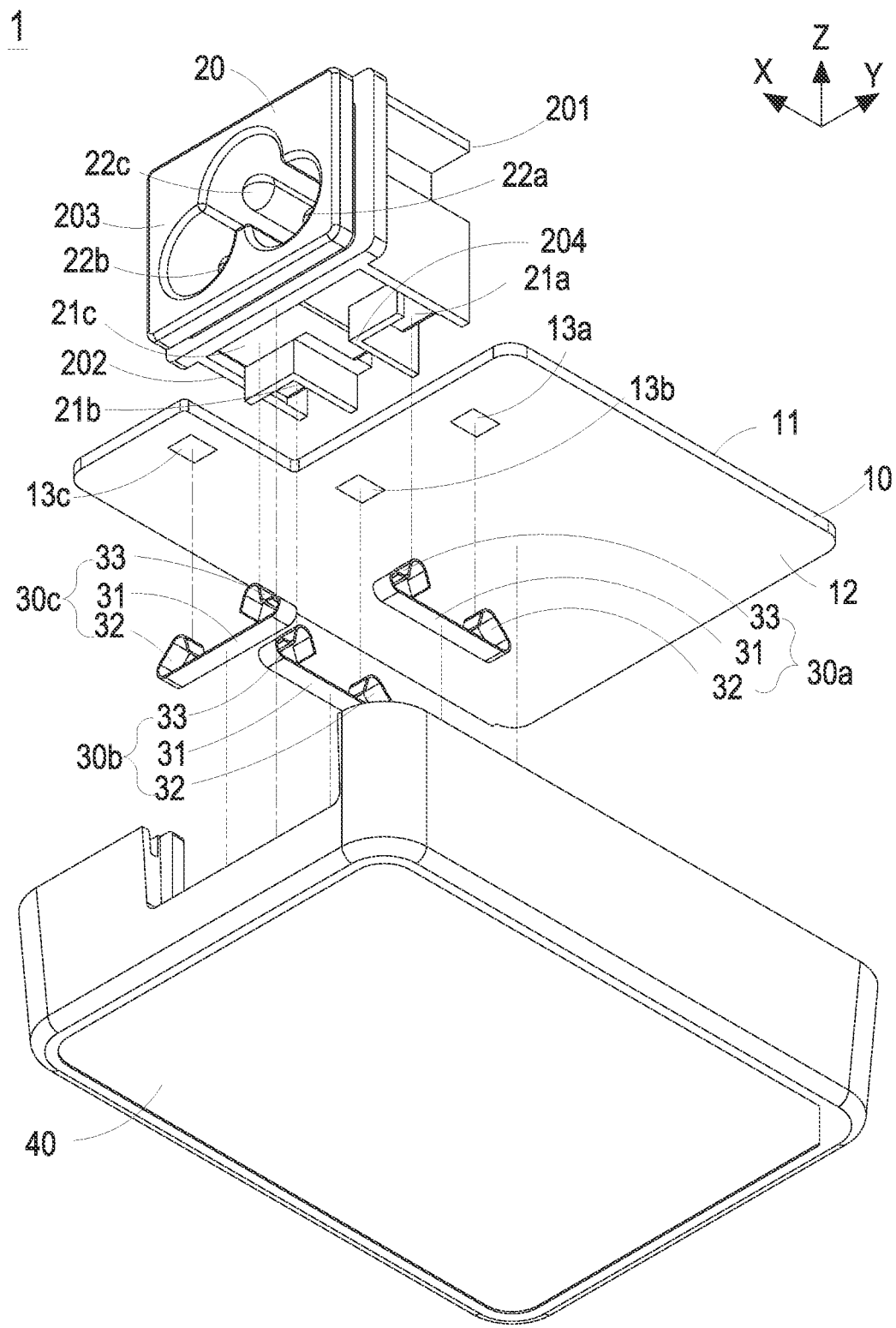
FIG. 3 is an exploded view illustrating the power adapter assembly structure according to the first embodiment of the present disclosure.
Figure 4:
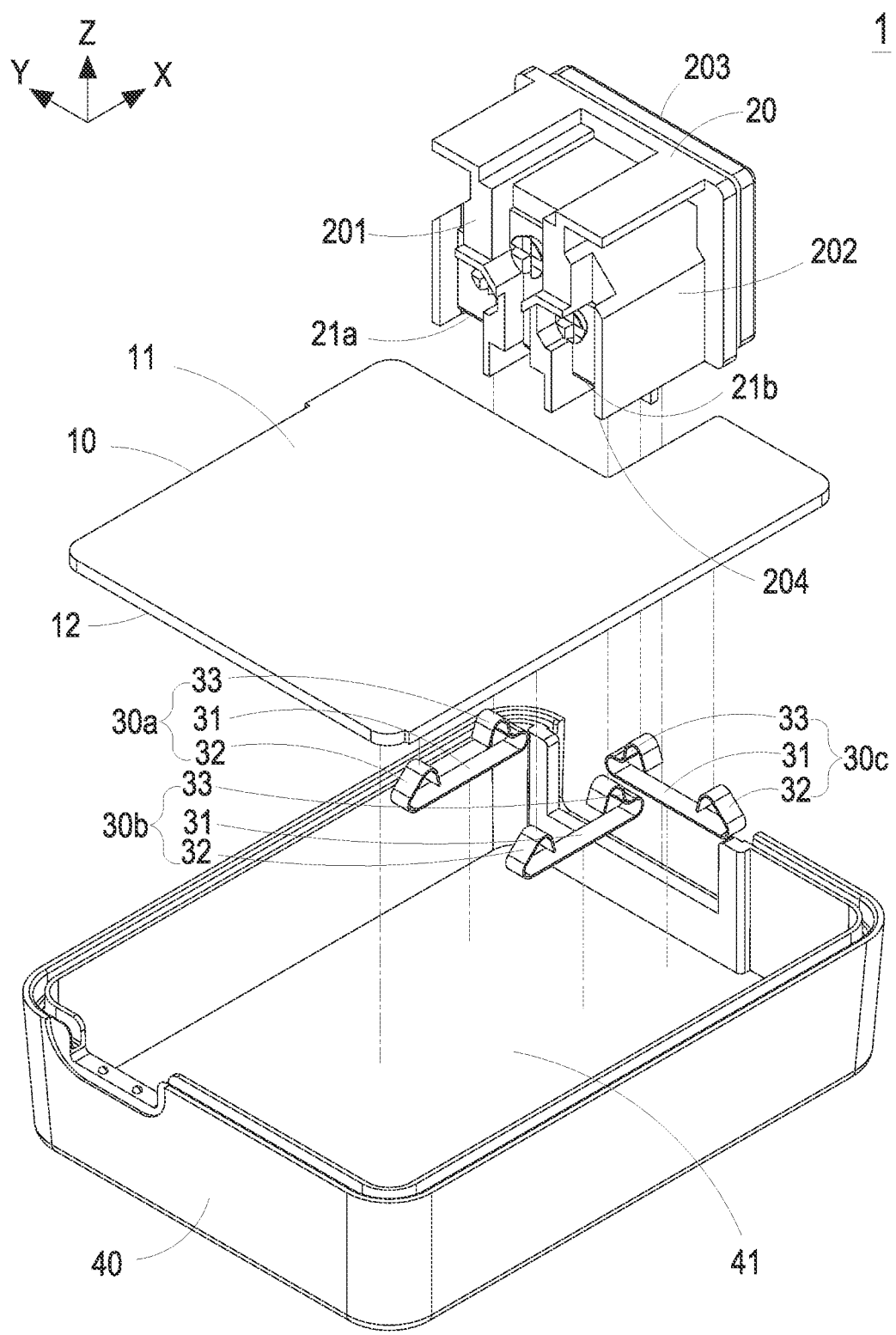
FIG. 4 is an exploded view illustrating the power adapter assembly structure according to the first embodiment of the present disclosure and taken from another perspective.
Figure 5:
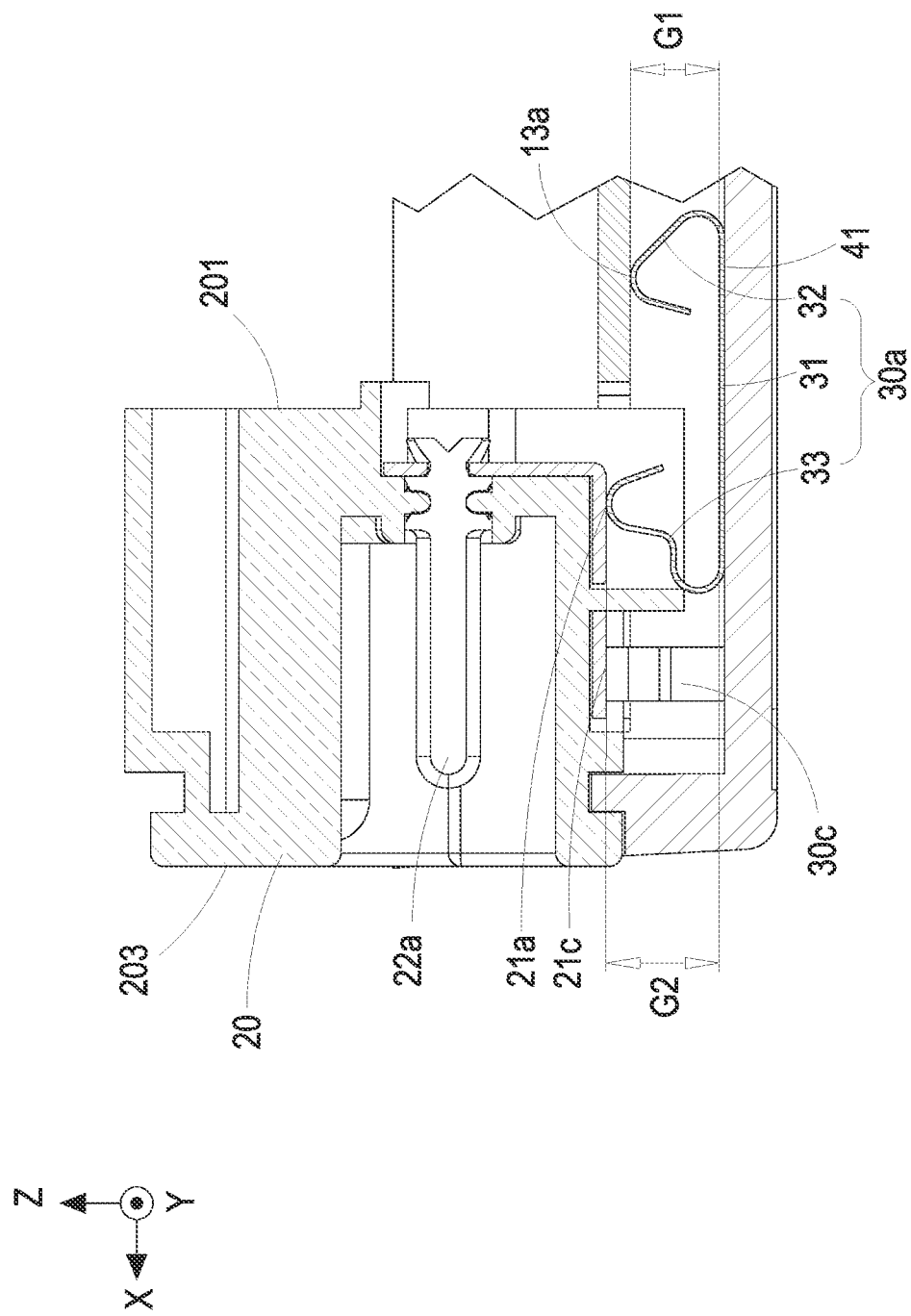
FIG. 5 is a vertical cross-sectional view illustrating the power adapter assembly structure according to the first embodiment of the present disclosure.
Figure 6:
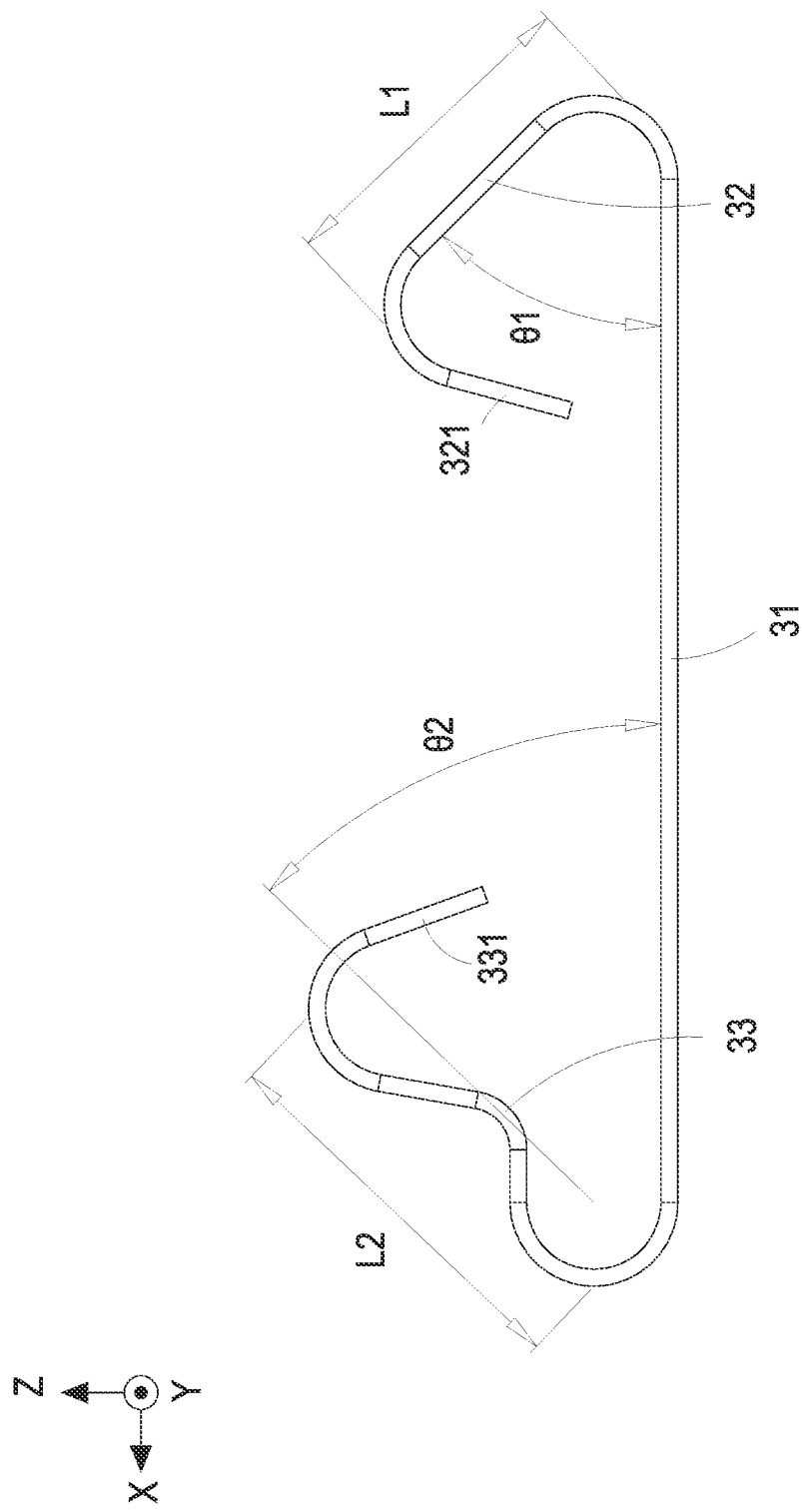
FIG. 6 is an exemplary structural view illustrating the elastic element of the power adapter assembly structure according to the first embodiment of the present disclosure.
Figure 7:
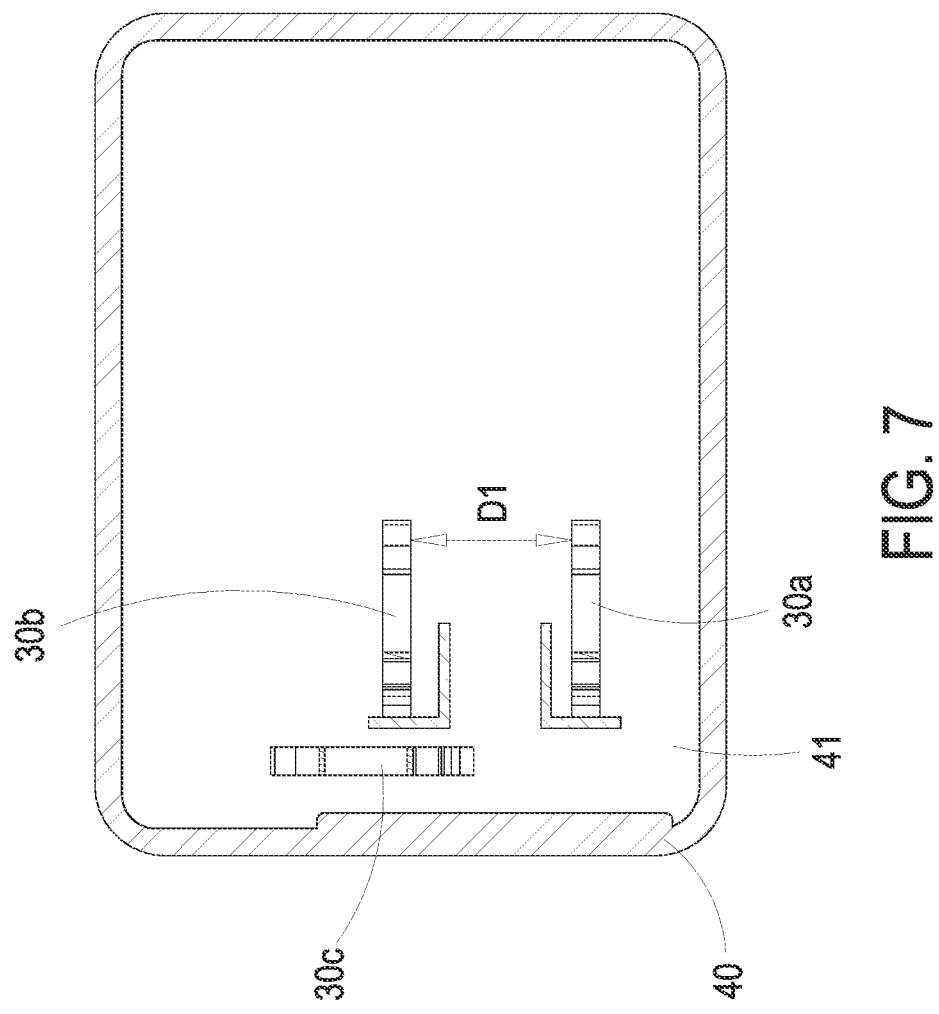
FIG. 7 is a horizontal cross-sectional view illustrating the power adapter assembly structure according to the first embodiment of the present disclosure.

FIGS. 1 and 2 are perspective views illustrating a power adapter assembly structure according to a first embodiment of the present disclosure. FIGS. 3 and 4 are exploded views illustrating the power adapter assembly structure according to the first embodiment of the present disclosure. FIG. 5 is a vertical cross-sectional view illustrating the power adapter assembly structure according to the first embodiment of the present disclosure. FIG. 6 is an exemplary structural view illustrating the elastic element of the power adapter assembly structure according to the first embodiment of the present disclosure. FIG. 7 is a horizontal cross-sectional view illustrating the power adapter assembly structure according to the first embodiment of the present disclosure. In the embodiment, the power adapter assembly structure 1 includes a housing 40, a circuit board 10, a socket 20 and at least one elastic element. Preferably but not exclusively, the at least one elastic element is any one of a first elastic element 30a, a second elastic element 30b and a third elastic element 30c. The housing 40 includes an installation surface 41. The circuit board 10 is fastened in the housing 40 and includes at least one first abutting surface. Preferably but not exclusively, the at least one first abutting surface includes a first live-wire abutting surface 13a, a first neutral-wire abutting surface 13b and a first earth-wire abutting surface 13c, which are disposed on the bottom surface 12 of the circuit board 10 and face the installation surface 41. In other embodiment, the first live-wire fixing surface 13a, the neutral-wire abutting surface 13b and the earth-wire abutting surface 13c are electrically connected to the top surface 11 of the circuit board 10, but the present disclosure is not limited thereto. In the embodiment, the socket 20 is fastened in the housing 40, and the socket 20 is disposed adjacent to the circuit board 10. Preferably but not exclusively, a rear side 201 and a lateral side 202 of the socket 20 spatially correspond to the edge of the circuit board 10. In the embodiment, the socket 20 includes at least one second abutting surface. Preferably but not exclusively, the at least one second abutting surface includes a second live-wire abutting surface 21a, a second neutral-wire abutting surface 21b and a second earth-wire abutting surface 21c, which are located at a bottom side 204 of the socket 20, respectively. The first elastic element 30a, the second elastic element 30b and the third elastic element 30c are connected between the circuit board 10 and the socket 20, respectively. In the embodiment, the first elastic element 30a, the second elastic element 30b and the third elastic element 30c have the same or similar structure, and each of which includes a main body 31, a first hanging arm 32 and a second hanging arm 33. The first hanging arm 32 and the second hanging arm 33 are disposed at two opposite ends of the main body 31. The first hanging arm 32 of the first elastic element 30a spatially corresponds to and constantly abuts the first live-wire abutting surface 13a, and the second hanging arm 33 of the first elastic element 30a spatially corresponds to and constantly abuts the second live-wire abutting surface 21a. The first hanging arm 32 of the second elastic element 30b spatially corresponds to and constantly abuts the first neutral-wire abutting surface 13b, and the second hanging arm 33 of the second elastic element 30b spatially corresponds to and constantly abuts the second neutral-wire abutting surface 21b. The first hanging arm 32 of the third elastic element 30c spatially corresponds to and constantly abuts the first earth-wire abutting surface 13c, and the second hanging arm 33 of the third elastic element 30c spatially corresponds to and constantly abuts the second earth-wire abutting surface 21c. It should be noted that the corresponding relationships of the first elastic element 30a, the second elastic element 30b, and the third elastic element 30c connected between the circuit board 10 and the socket 20 are merely illustrative. Taking the first elastic element 30a as an example for illustration, a first gap G1 is formed between the main body 31 of the first elastic element 30a and the corresponding first live-wire abutting surface 13a, and a second gap G2 is formed between the main body 31 of the first elastic element 30a and the corresponding second live-wire abutting surface 21a, as shown in FIG. 5. In addition, the first hanging arm 32 of the first elastic element 30a is extended from the main body 31 to form a first length L1 of the first hanging arm 32, and the second hanging arm 33 of the first elastic element 30a is extended from the main body 31 to form a second length L2 of the second hanging arm 33, as shown in FIG. 6. In the embodiment, the first gap G1 is less than the first length L1 of the first hanging arm 32, and the second gap G2 is less than the second length L2 of the second hanging arm 33. In that, when the socket 20 and the circuit board 10 are fixed to the housing 40, the first hanging arm 32 of the first elastic element 30a is pressed by the circuit board 10 to generate an elastic force against the corresponding first live-wire abutting surface 13a, and the second hanging arm 33 of the first elastic element 30a is pressed by the socket 20 to generate an elastic force against the corresponding second live-wire abutting surface 21a. The second elastic element 30b and the third elastic element 30c are also connected between the circuit board 10 and the socket 20 in the same manner.

Preferably but not exclusively, in the embodiment, each of the first elastic element 30a, the second elastic element 30b and the third elastic element 30c is integrally formed into one piece by a conductive metal sheet. The first elastic element 30a is connected between the first live-wire abutting surface 13a of the circuit board 10 and the second live-wire abutting surface 21a of the socket 20. The second elastic element 30b is connected between the first neutral-wire abutting surface 13b of the circuit board 10 and the second neutral abutting surface 21b of the socket 20. The third elastic element 30c is connected between the first earth-wire abutting surface 13c of the circuit board 10 and the second earth-wire abutting surface 21c of the socket 20. Whereby, a stable electrical connection between the socket 20 and the circuit board 10 is achieved. The first elastic element 30a is taken as the example for illustration. When the circuit board 10 and the socket 20 are fixed to the housing 40, the first hanging arm 32 and the second hanging arm 33 of the first elastic element 30a are pressed by the circuit board 10 and the socket 20, respectively, during assembling, and elastic forces are generated to constantly abut the corresponding first live-wire abutting surface 13a and the corresponding second live-wire abutting surface 21a. Therefore, the installation procedure of the first elastic element 30a, the second elastic element 30b and the third elastic element 30c is combined with the assembling procedure of the socket 20 and the circuit board 10, so as to realize the power adapter assembly structure 1 of the socket 20, the circuit board 10, the first elastic element 30a, the second elastic element 30b and the third elastic element 30c by the automatic assembling equipment, and ensure the electrical connection between the socket 20 and the circuit board 10.

Moreover, in the embodiment, taking the first elastic element 30a as the example for illustration, the first hanging arm 32 and the main body 31 form a first included angle θ1, and the second hanging arm 33 and the main body 31 form a second included angle θ2. Preferably but not exclusively, the first included angle θ1 and the second included angle θ1 are an acute angle, respectively, ranged from 1° to 89°, so as to provide the elastic force and increase the structural strength. It is helpful to combine the assembling procedure of the socket 20 and the circuit board 10 to realize the power adapter assembly structure 1. In an embodiment, the second hanging arm 33 of the first elastic element 20a is in a wavy bent shape so as to enhance the structural strength and the elastic force. In other embodiments, the first hanging arm 32 is in a wavy bent shape, but the present disclosure is not limited thereto. In the embodiment, the first hanging arm 32 of the first elastic element 30a further includes a first extension section 321, which is connected to the first hanging arm 32 and extended from the corresponding first live-wire abutting surface 13a toward the main body 31, so as to facilitate the first hanging arm 32 to firmly abut against the first live-wire abutting surface 13a and increase the structural strength of the first elastic element 30a. Similarly, the second hanging arm 33 of the first elastic element 30a further includes a second extension section 331, which is connected to the second hanging arm 33 and extended from the corresponding second live-wire abutting surface 21a toward the main body 31, so as to facilitate the second hanging arm 33 to firmly abut against the second live-wire abutting surface 21a and increase the structural strength of the first elastic element 30a. Certainly, the present disclosure is not limited thereto.

In the embodiment, the first live-wire abutting surface 13a and the first neutral-wire abutting surface 13b of the circuit board 10 are disposed adjacent to the rear side 201 of the socket 20. The first earth-wire abutting surface 13c of the circuit board 10 is disposed adjacent to the lateral side 202 of the socket 20. In the embodiment, the first elastic element 30a connected between the first live-wire abutting surface 13a and the second live-wire abutting surface 21a, and the second elastic element 30b connected between the first neutral-wire abutting surface 13b and the second neutral-wire abutting surface 21b are led out from the rear side 201 of the socket 20 and arranged in parallel to the X-axis direction. A minimum distance D1 is maintained between the first elastic element 30a and the second elastic element 30b, so as to ensure that the minimum distance D1 maintained between the first elastic element 30a and the second elastic element 30b meets the safety requirements for electrical clearance and creepage distance. Moreover, in the embodiment, the third elastic element 30c connected between the first earth-wire abutting surface 13c and the second earth-wire abutting surface 21c is led out from the lateral side 202 of the socket 20 and arranged along the Y-axis direction. It ensures that the first elastic element 30a, the second elastic element 30b and the third elastic element 30c meet the safety requirements of electrical clearance and creepage distance. Moreover, it avoids electrical EMI/RFI interference caused by crossed wires. In the embodiment, each of the second live-wire abutting surface 21a, the second neutral-wire abutting surface 21b and the second earth-wire abutting surface 21c is formed by a conductive metal sheet. The socket 20 further includes three conductive pins. Preferably but not exclusively, the three conductive pins include a live-wire pin 22a, a neutral-wire pin 22b and an earth-wire pin 22c extended from the rear side 201 to a front side 203 opposite to the rear side 201, along the X-axis direction. Preferably but not exclusively, the live-wire pin 22a, the neutral-wire pin 22b, and the earth-wire pin 22c are electrically connected to the conductive metal sheets of the second live-wire abutting surface 21a, the second neutral-wire abutting surface 21b, and the second earth-wire abutting surface 21c by riveting, respectively.

In the embodiment, the first elastic element 30a, the second elastic element 30b, and the third elastic element 30c are pre-set on the installation surface 41 of the housing 40, respectively. When the circuit board 10 and the socket 20 are fixed to the housing 40, the first live-wire abutting surface 13a, the first neutral-wire abutting surface 13b and the first earth-wire abutting surface 13c of the circuit board 10 push the first hanging arms 32 of the first elastic element 30a, the second elastic element 30b and the third elastic element 30c, respectively, in the Z-axis direction, and the second live-wire abutting surface 21a, the second neutral-wire abutting surface 21b and the second earth-wire abutting surface 21c of the socket 20 push the second hanging arms 33 of the first elastic element 30a, the second elastic element 30b and the third elastic element 30c, respectively, in the Z-axis direction, so as to complete the assembling procedure of the power adapter assembly structure 1. Since the electrical connection between the socket 20 and the circuit board 10 is achieved through the first elastic element 30a, the second elastic element 30b and the third elastic element 30c with structural strength, combined with the assembling procedure of the socket 20 and the circuit board 10 on the housing 40, it is more helpful to realize the power adapter assembly structure 1 of the housing 40, the socket 20, the circuit board 10, the first elastic element 30a, the second elastic element 30b and the third elastic element 30c by an automated production method. The assembling procedure is simplified, the production cost is reduced, and the competitiveness of the product is enhanced.

Figure 8:
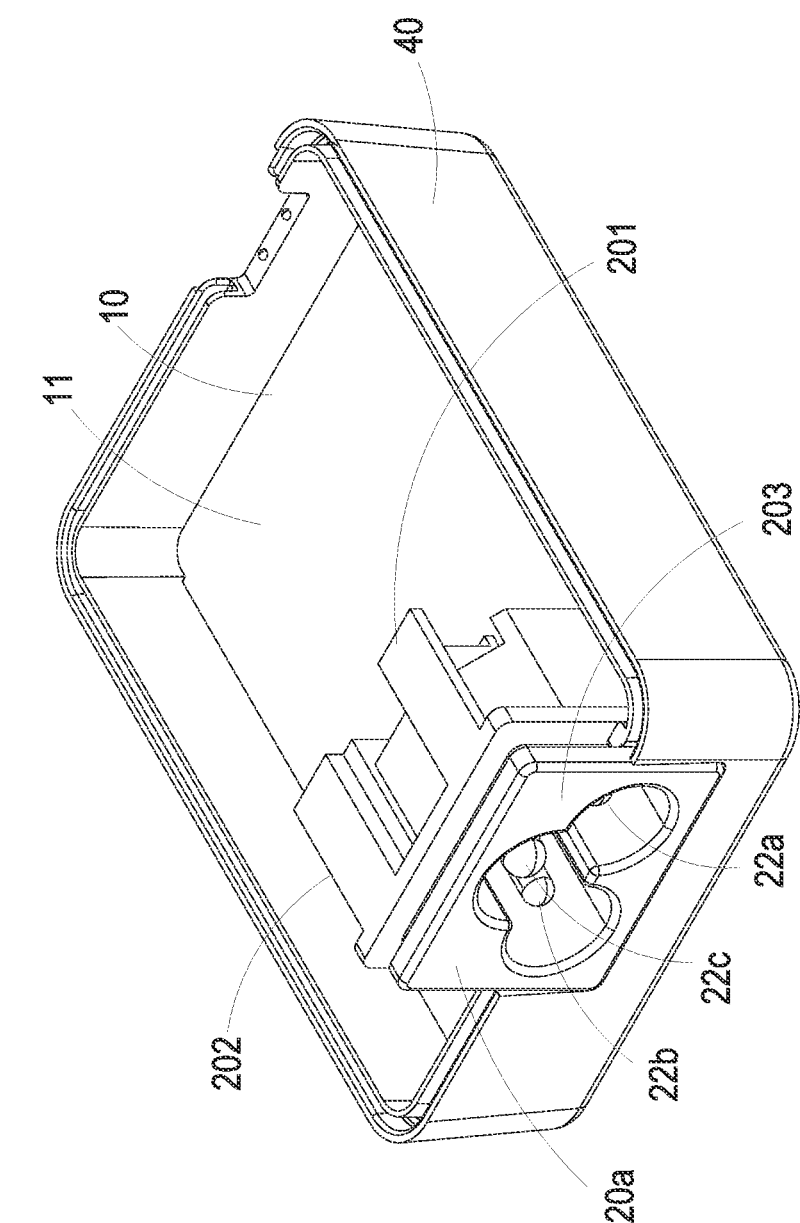
FIG. 8 is a perspective view illustrating a power adapter assembly structure according to a second embodiment of the present disclosure.
Figure 9:
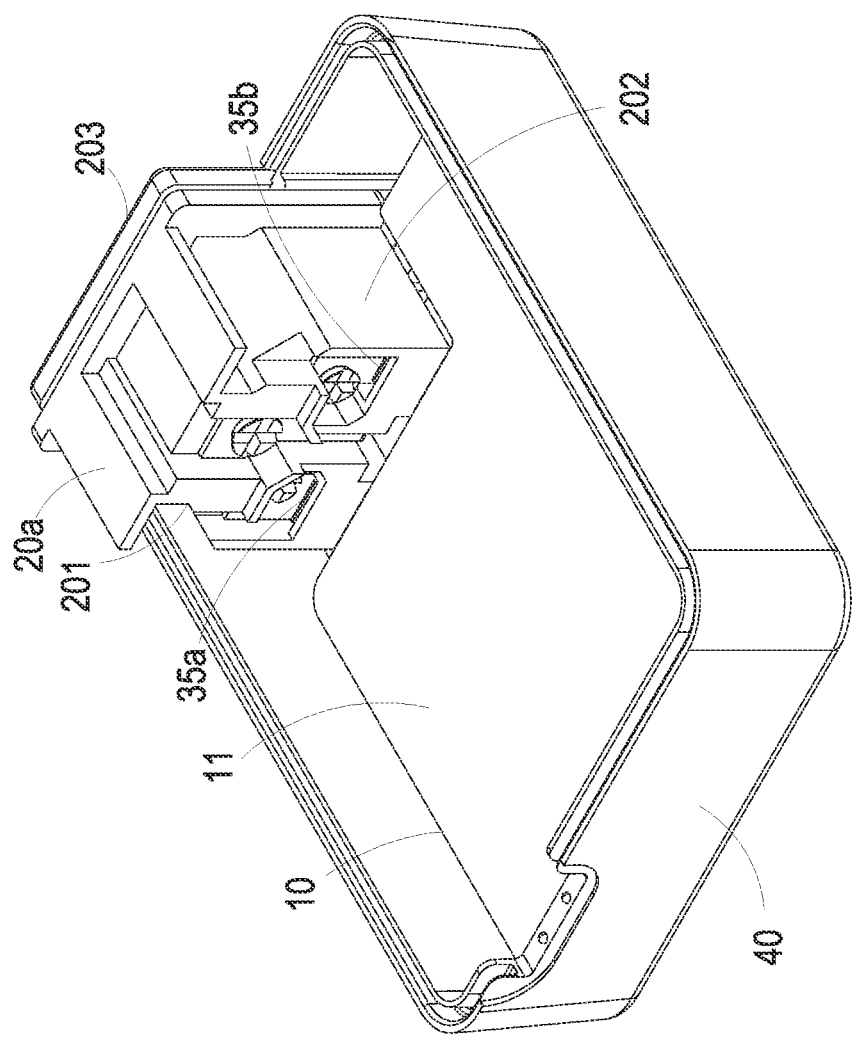
FIG. 9 is a perspective view illustrating the power adapter assembly structure according to the second embodiment of the present disclosure and taken from another perspective.
Figure 10:
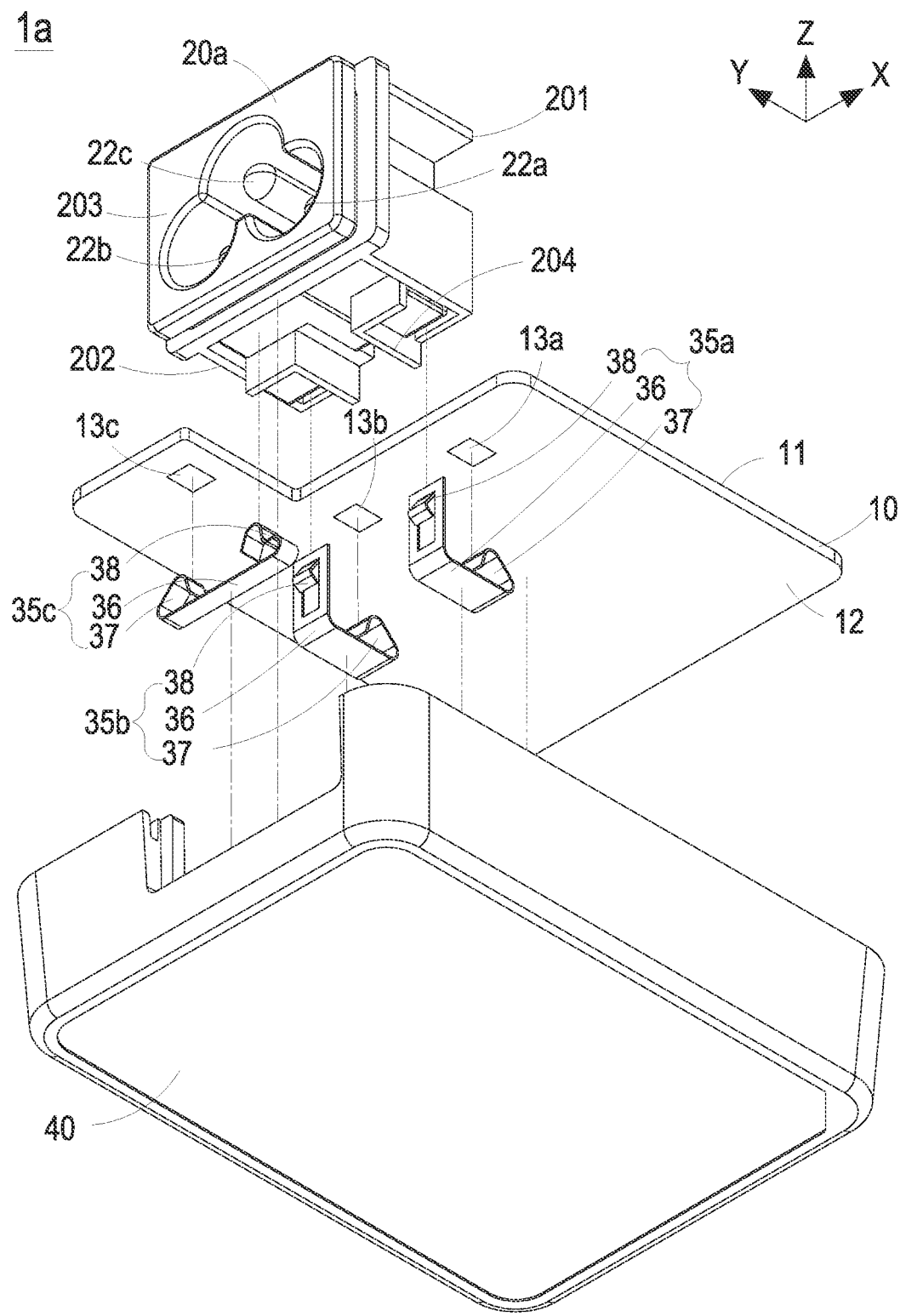
FIG. 10 is an exploded view illustrating the power adapter assembly structure according to the second embodiment of the present disclosure.
Figure 11:
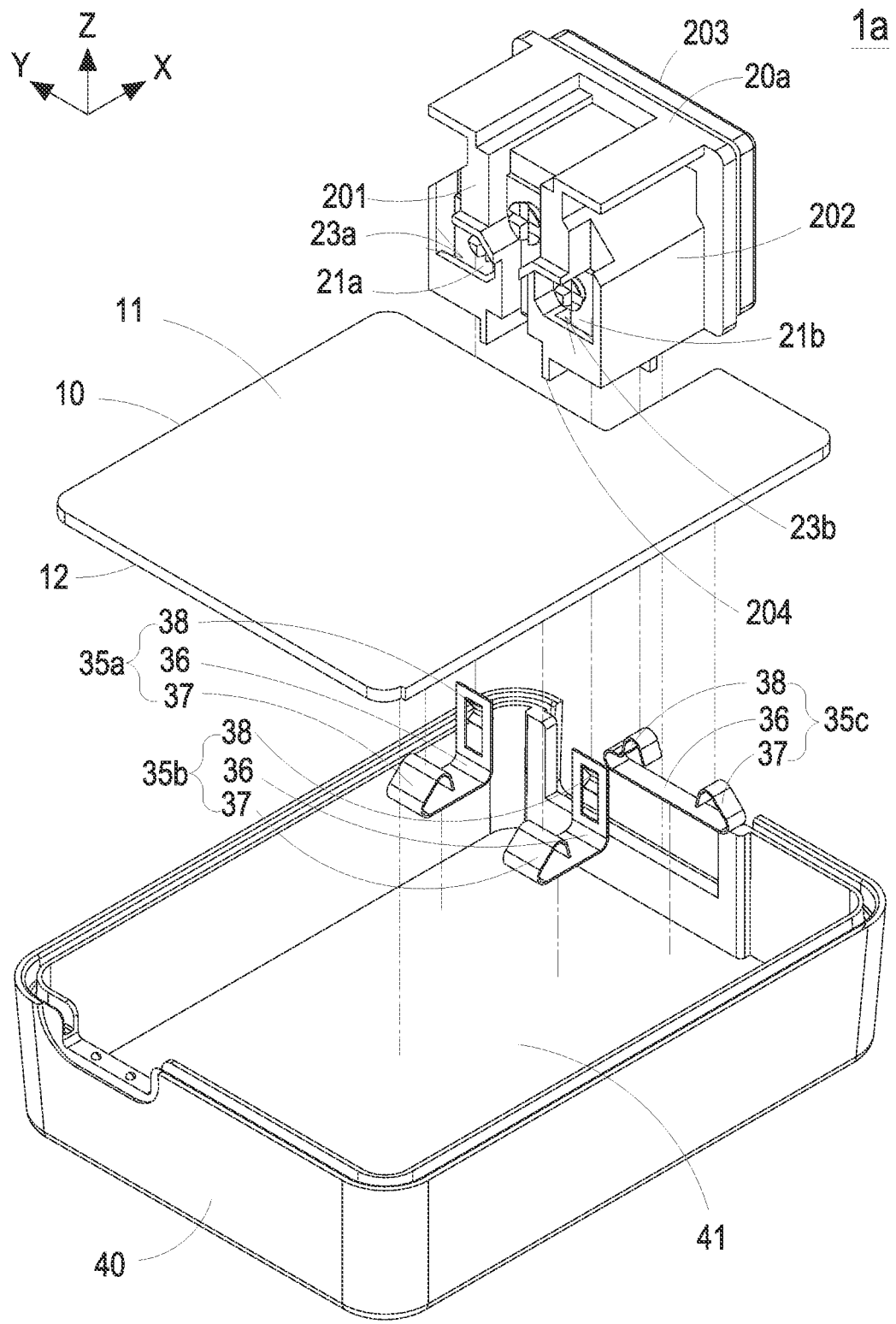
FIG. 11 is an exploded view illustrating the power adapter assembly structure according to the second embodiment of the present disclosure and taken from another perspective.
Figure 12:
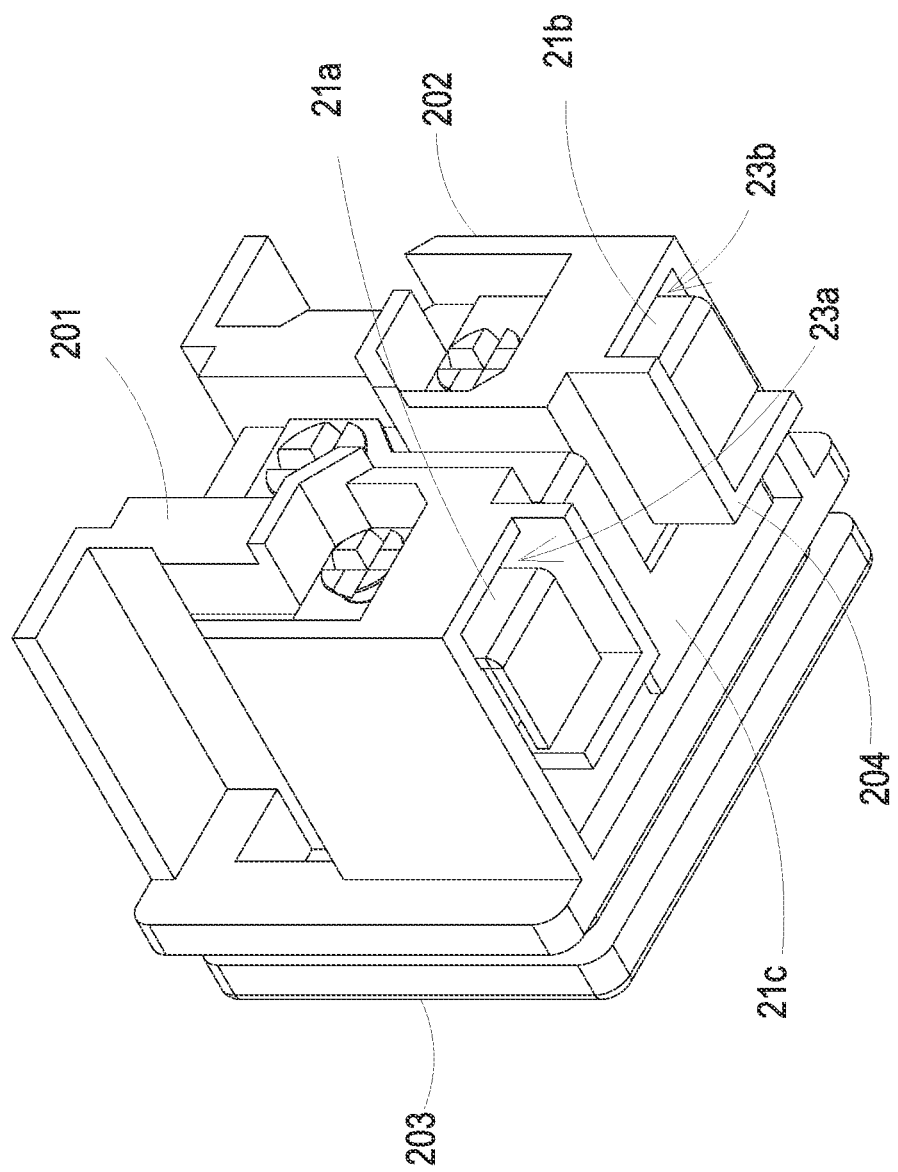
FIG. 12 is a perspective view illustrating the socket of the power adapter assembly structure according to the second embodiment of the present disclosure.
Figure 13:
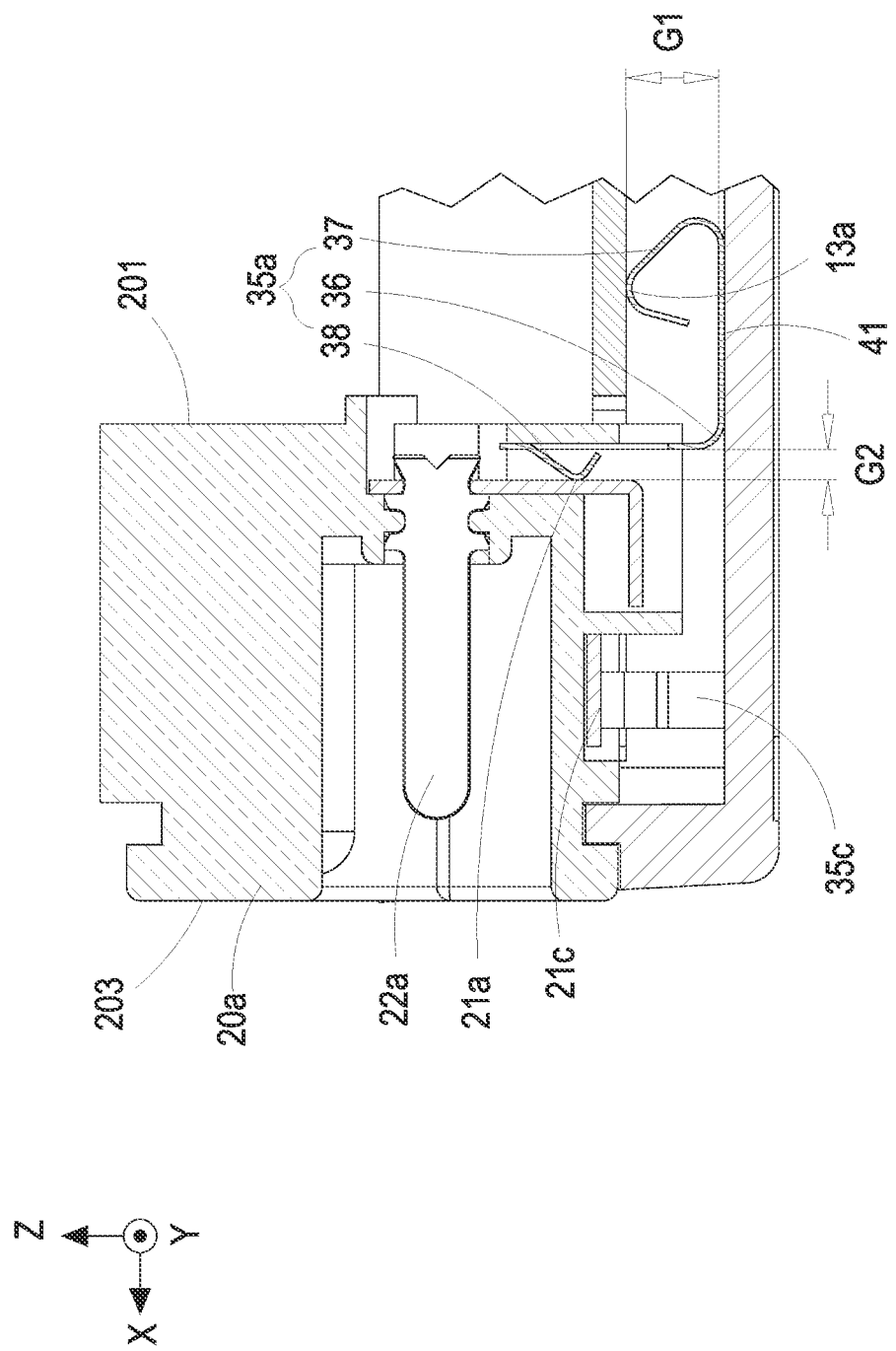
FIG. 13 is a vertical cross-sectional view illustrating the power adapter assembly structure according to the second embodiment of the present disclosure.
Figure 14:
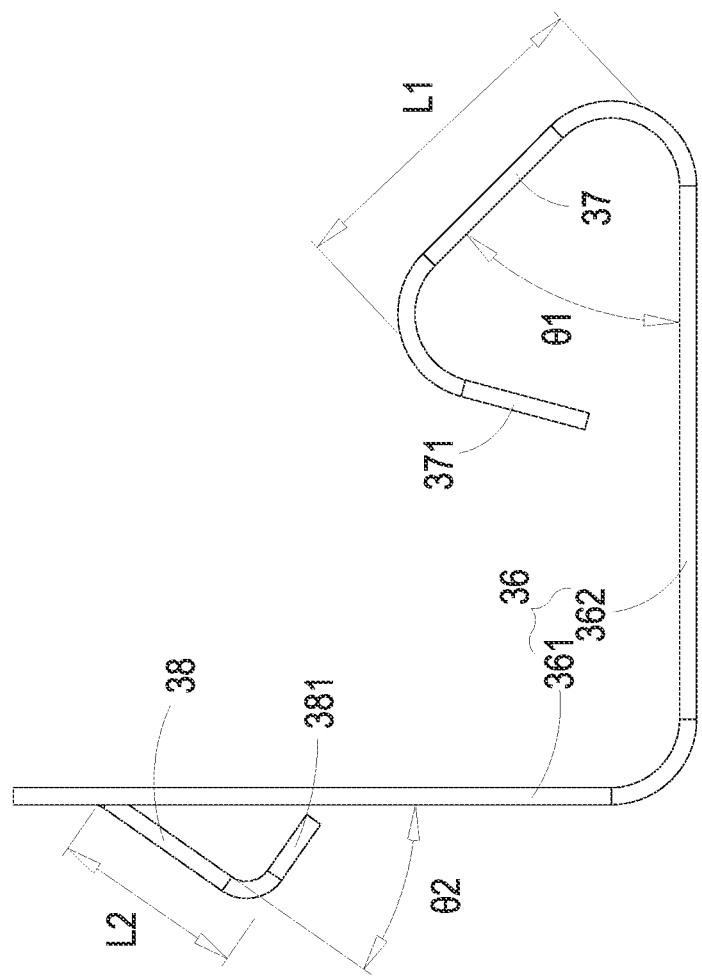
FIG. 14 is an exemplary structural view illustrating the elastic element of the power adapter assembly structure according to the second embodiment of the present disclosure.
Figure 15:
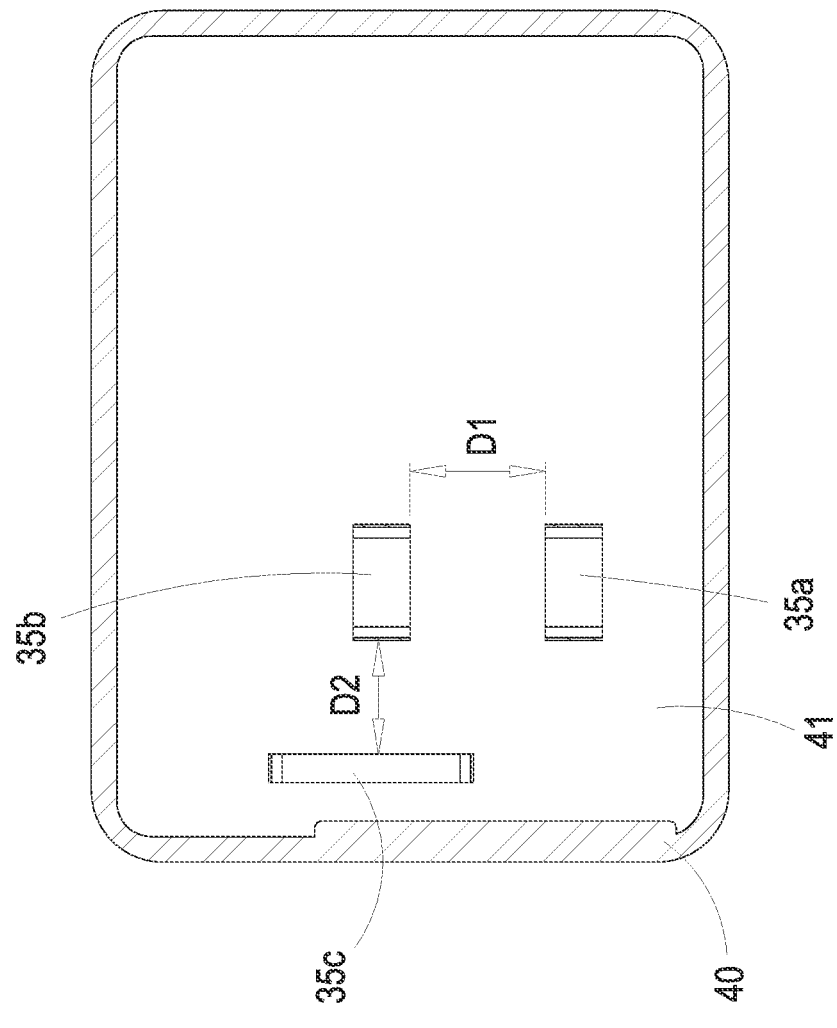
FIG. 15 is a horizontal cross-sectional view illustrating the power adapter assembly structure according to the second embodiment of the present disclosure.

FIGS. 8 and 9 are perspective views illustrating a power adapter assembly structure according to a second embodiment of the present disclosure. FIGS. 10 and 11 are exploded views illustrating the power adapter assembly structure according to the second embodiment of the present disclosure. FIG. 12 is a vertical cross-sectional view illustrating the power adapter assembly structure according to the second embodiment of the present disclosure. FIG. 13 is a vertical cross-sectional view illustrating the power adapter assembly structure according to the second embodiment of the present disclosure. FIG. 14 is an exemplary structural view illustrating the elastic element of the power adapter assembly structure according to the second embodiment of the present disclosure. FIG. 15 is a horizontal cross-sectional view illustrating the power adapter assembly structure according to the second embodiment of the present disclosure. In the embodiment, the structures, elements and functions of the power adapter assembly structure 1a are similar to those of the power adapter assembly structure 1 of FIGS. 1 to 7, and are not redundantly described herein. In the embodiment, the power adapter assembly structure 1a includes a housing 40, a circuit board 10, a socket 20a, a first elastic element 35a, a second elastic element 35b and a third elastic element 35c. The housing 40 includes an installation surface 41. The circuit board 10 is fastened in the housing 40 and includes at least one first abutting surface. Preferably but not exclusively, the at least one first abutting surface includes a first live-wire abutting surface 13a, a first neutral-wire abutting surface 13b and a first earth-wire abutting surface 13c, which are disposed on the bottom surface 12 of the circuit board 10 and face the installation surface 41. In the embodiment, the socket 20a is fastened in the housing 40, and the socket 20a is disposed adjacent to the circuit board 10. Preferably but not exclusively, a rear side 201 and a lateral side 202 of the socket 20a spatially correspond to the edge of the circuit board 10. In the embodiment, the socket 20a includes at least one second abutting surface. Preferably but not exclusively, the at least one second abutting surface includes a second live-wire abutting surface 21a, a second neutral-wire abutting surface 21b and a second earth-wire abutting surface 21c. The second live-wire abutting surface 21a and the second neutral-wire abutting surface 21b are located at the rear side 201 of the socket 20a, respectively, and the second earth-wire abutting surface 21c is located at the bottom side 204 of the socket 20a. The first elastic element 35a, the second elastic element 35b and the third elastic element 35c are connected between the circuit board 10 and the socket 20a, respectively. In the embodiment, the first elastic element 35a, the second elastic element 35b and the third elastic element 35c have the same or similar structure, and each of which includes a main body 36, a first hanging arm 37 and a second hanging arm 38. In the embodiment, the main body 36 further includes a fitting section 362 and a standing section 361. The fitting section 362 spatially corresponds to the corresponding first abutting surface, such as the first live-wire abutting surface 13a, the first neutral-wire abutting surface 13b and the earth-wire abutting surface 13c, and is attached to the installation surface 41. The standing section 361 spatially corresponds to the corresponding second abutting surface, such as the second live-wire abutting surface 21a, the second neutral-wire abutting surface 21b and the second earth-wire abutting surface 21c. In the embodiment, the fitting section 362 is connected to the standing section 361, the first hanging arm 37 and the standing section 361 are located at two opposite ends of the fitting section 362, and the second hanging arm 38 and the fitting section 362 are located at two opposite ends of the standing section 361.

In the embodiment, the second live-wire abutting surface 21a and the second neutral-wire abutting surface 21b are located at the rear side 201 of the socket 20a. In order to combine the assembling procedure of pressing down and fixing the socket 20a to the housing 40, the socket 20a further includes a first receiving slot 23a and a second receiving slot 23b, which are disposed on the rear side 201 of the socket 20a. The first receiving slot 23a is configured to partially receive the second live-wire abutting surface 21a, and the second hanging arm 38 and the standing section 361 of the main body 36 of the first elastic element 35a. In that, when the socket 20a is fixed to the housing 40, the standing section 361 of the main body 36 of the first elastic element 35a is inserted into the first receiving slot 23a, so as to realize that the second hanging arm 38 of the first elastic element 35a constantly abuts the second live-wire abutting surface 21a. Similarly, the second receiving slot 23b is configured to partially receive the second neutral-wire abutting surface 21b, and the second hanging arm 38 and the standing section 361 of the main body 36 of the second elastic element 35b. In that, when the socket 20a is fixed to the housing 40, the standing section 361 of the main body 36 of the second elastic element 35b is inserted into the second receiving slot 23b, so as to realize that the second hanging arm 38 of the second elastic element 35b constantly abuts the second neutral-wire abutting surface 21b.

In the embodiment, the first hanging arm 37 of the first elastic element 35a spatially corresponds to and constantly abuts the first live-wire abutting surface 13a, and the second hanging arm 38 of the first elastic element 35a spatially corresponds to and constantly abuts the second live-wire abutting surface 21a. The first hanging arm 37 of the second elastic element 35b spatially corresponds to and constantly abuts the first neutral-wire abutting surface 13b, and the second hanging arm 38 of the second elastic element 35b spatially corresponds to and constantly abuts the second neutral-wire abutting surface 21b. The first hanging arm 37 of the third elastic element 35c spatially corresponds to and constantly abuts the first earth-wire abutting surface 13c, and the second hanging arm 38 of the third elastic element 35c spatially corresponds to and constantly abuts the second earth-wire abutting surface 21c. It should be noted that the corresponding relationships of the first elastic element 35a, the second elastic element 35b, and the third elastic element 35c connected between the circuit board 10 and the socket 20a are merely illustrative. Taking the first elastic element 35a as an example for illustration, a first gap G1 is formed between the fitting section 362 of the main body 36 of the first elastic element 35a and the corresponding first live-wire abutting surface 13a, and a second gap G2 is formed between the standing section 361 of the main body 36 of the first elastic element 35a and the corresponding second live-wire abutting surface 21a, as shown in FIG. 13. In addition, the first hanging arm 37 of the first elastic element 35a is extended from the fitting section 362 of the main body 36 to form a first length L1 of the first hanging arm 37, and the second hanging arm 38 of the first elastic element 35a is extended from the standing section 361 of main body 36 to form a second length L2 of the second hanging arm 38, as shown in FIG. 14. In the embodiment, the first gap G1 is less than the first length L1 of the first hanging arm 37, and the second gap G2 is less than the second length L2 of the second hanging arm 38. In that, when the socket 20b and the circuit board 10 are fixed to the housing 40, the first hanging arm 37 of the first elastic element 35a is pressed by the circuit board 10 to generate an elastic force against the corresponding first live-wire abutting surface 13a, and the second hanging arm 38 of the first elastic element 35a is pressed by the socket 20a to generate an elastic force against the corresponding second live-wire abutting surface 21a. The second elastic element 35b and the third elastic element 35c are also connected between the circuit board 10 and the socket 20b in the same manner.

Preferably but not exclusively, in the embodiment, each of the first elastic element 35a, the second elastic element 35b and the third elastic element 35c is integrally formed into one piece by a conductive metal sheet. The first elastic element 35a is connected between the first live-wire abutting surface 13a of the circuit board 10 and the second live-wire abutting surface 21a of the socket 20a. The second elastic element 35b is connected between the first neutral-wire abutting surface 13b of the circuit board 10 and the second neutral abutting surface 21b of the socket 20a. The third elastic element 35c is connected between the first earth-wire abutting surface 13c of the circuit board 10 and the second earth-wire abutting surface 21c of the socket 20a. Whereby, a stable electrical connection between the socket 20a and the circuit board 10 is achieved. The first elastic element 35a is taken as the example for illustration. When the circuit board 10 and the socket 20a are fixed to the housing 40, the first hanging arm 37 of the first elastic element 35a is pressed by the circuit board 10, and an elastic force is generated to constantly abut the corresponding first live-wire abutting surface 13a. Moreover, when the standing section 361 is inserted in the first receiving slot 23a, an elastic force is generated by the second hanging arm 38 of the first elastic element 35a to constantly abut the corresponding second live-wire abutting surface 21a. Therefore, the installation procedure of the first elastic element 35a, the second elastic element 35b and the third elastic element 35c is combined with the assembling procedure of the socket 20a and the circuit board 10 on the housing 40, so as to realize the power adapter assembly structure 1a of the housing 40, the socket 20a, the circuit board 10, the first elastic element 35a, the second elastic element 35b and the third elastic element 35c by the automatic assembling equipment, and ensure the electrical connection between the socket 20a and the circuit board 10.

In the embodiment, taking the first elastic element 35a as the example for illustration, the first hanging arm 37 and the fitting section 362 of the main body 36 form a first included angle $\theta1$, and the second hanging arm 38 and the standing section 361 of the main body 36 form a second included angle $\theta2$. Preferably but not exclusively, the first included angle $\theta1$ and the second included angle $\theta1$ are an acute angle, respectively, ranged from 1° to 89°, so as to provide the elastic force and increase the structural strength. It is helpful to combine the assembling procedure of the socket 20*a* and the circuit board 10 to realize the power adapter assembly structure 1*a*. In the embodiment, the first hanging arm 37 of the first elastic element 35*a* further includes a first extension section 371, which is connected to the first hanging arm 37 and extended from the corresponding first live-wire abutting surface 13*a* toward the main body 36, so as to facilitate the first hanging arm 37 to firmly abut against the first live-wire abutting surface 13*a* and increase the structural strength of the first elastic element 35*a*. Similarly, the second hanging arm 38 of the first elastic element 35*a* further includes a second extension section 381, which is connected to the second hanging arm 38 and extended from the corresponding second live-wire abutting surface 21*a* toward the main body 36, so as to facilitate the second hanging arm 38 to firmly abut against the second live-wire abutting surface 21*a* and increase the structural strength of the first elastic element 35*a*. Certainly, the present disclosure is not limited thereto.

In the embodiment, the first live-wire abutting surface 13*a* and the first neutral-wire abutting surface 13*b* of the circuit board 10 are disposed adjacent to the rear side 201 of the socket 20*a*. The first earth-wire abutting surface 13*c* of the circuit board 10 is disposed adjacent to the lateral side 202 of the socket 20*a*. In the embodiment, the first elastic element 35*a* connected between the first live-wire abutting surface 13*a* and the second live-wire abutting surface 21*a*, and the second elastic element 35*b* connected between the first neutral-wire abutting surface 13*b* and the second neutral-wire abutting surface 21*b* are led out from the rear side 201 of the socket 20*a* and arranged in parallel to each other. A minimum distance D1 is maintained between the first elastic element 35*a* and the second elastic element 35*b* in the Y-axis direction, so as to ensure that the minimum distance D1 maintained between the first elastic element 35*a* and the second elastic element 35*b* meets the safety requirements for electrical clearance and creepage distance. Moreover, in the embodiment, the third elastic element 35*c* connected between the first earth-wire abutting surface 13*c* and the second earth-wire abutting surface 21*c* is led out from the lateral side 202 of the socket 20*a* and arranged along the Y-axis direction. A minimum distance D2 is maintained between the third elastic element 35*c* and the second elastic element 35*b*. It further ensures that the minimum distance D2 maintained between the second elastic element 35*b* and the third elastic element 35*c* meets the safety requirements of electrical clearance and creepage distance. Moreover, it avoids electrical EMI/RFI interference caused by crossed wires. In the embodiment, each of the second live-wire abutting surface 21*a*, the second neutral-wire abutting surface 21*b* and the second earth-wire abutting surface 21*c* is formed by a conductive metal sheet. The socket 20*a* further includes three conductive pins. Preferably but not exclusively, the three conductive pins include a live-wire pin 22*a*, a neutral-wire pin 22*b* and an earth-wire pin 22*c* extended from the rear side 201 to a front side 203 opposite to the rear side 201, along the X-axis direction. Preferably but not exclusively, the live-wire pin 22*a*, the neutral-wire pin 22*b*, and the earth-wire pin 22*c* are electrically connected to the conductive metal sheets of the second live-wire abutting surface 21*a*, the second neutral-wire abutting surface 21*b*, and the second earth-wire abutting surface 21*c* by riveting, respectively. Certainly, the present disclosure is not limited thereto, and not redundantly described.

Figure 16:
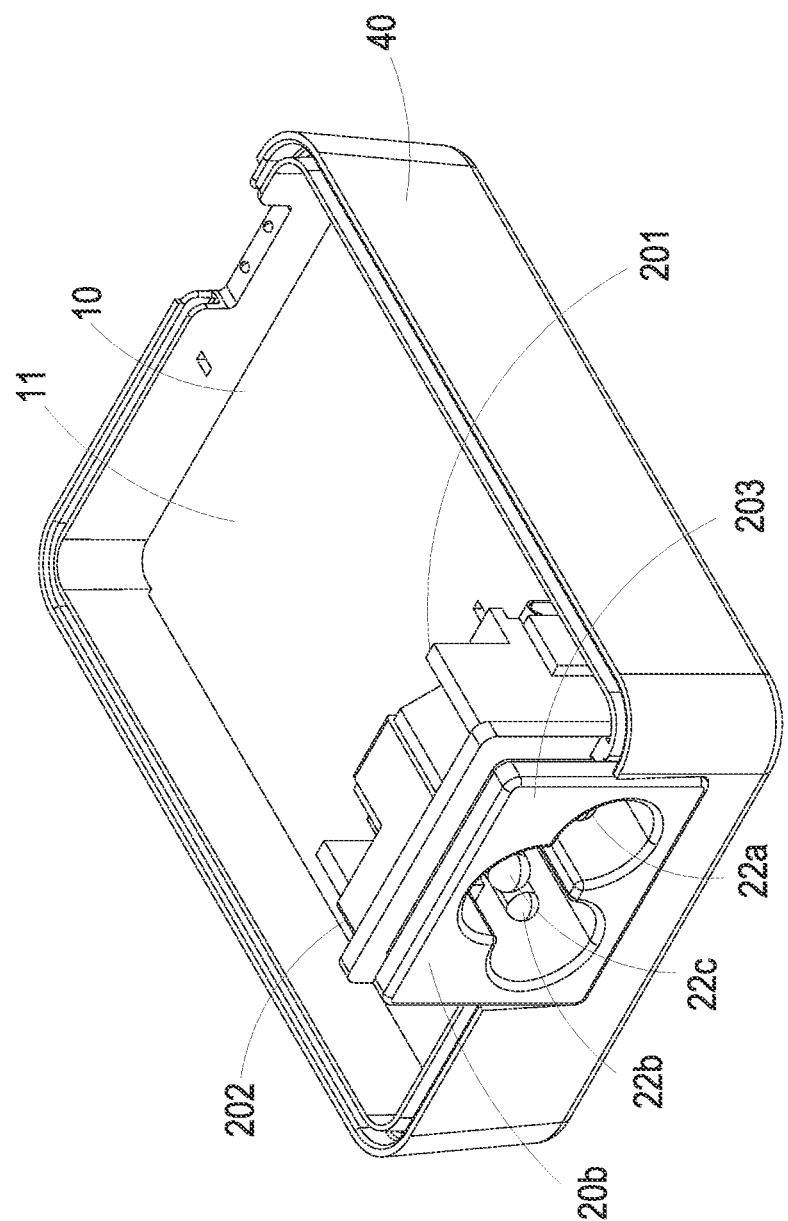
FIG. 16 is a perspective view illustrating a power adapter assembly structure according to a third embodiment of the present disclosure.
Figure 17:
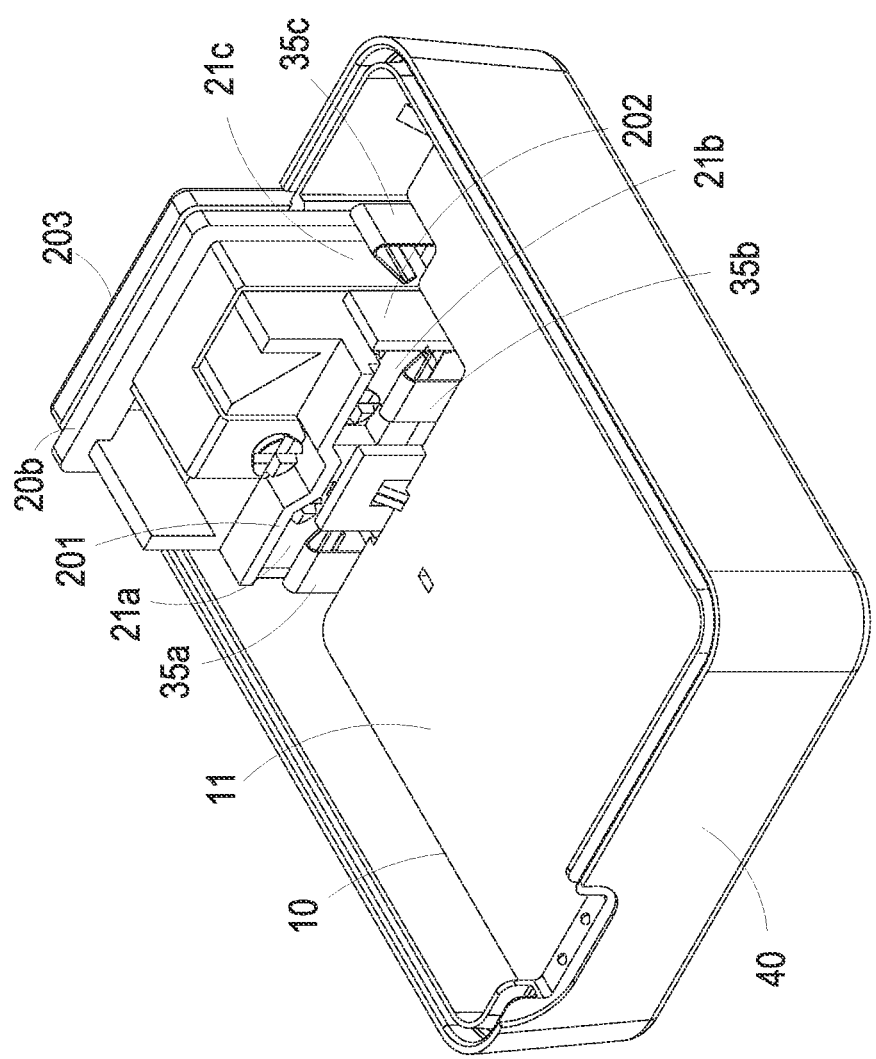
FIG. 17 is a perspective view illustrating the power adapter assembly structure according to the third embodiment of the present disclosure and taken from another perspective.
Figure 18:
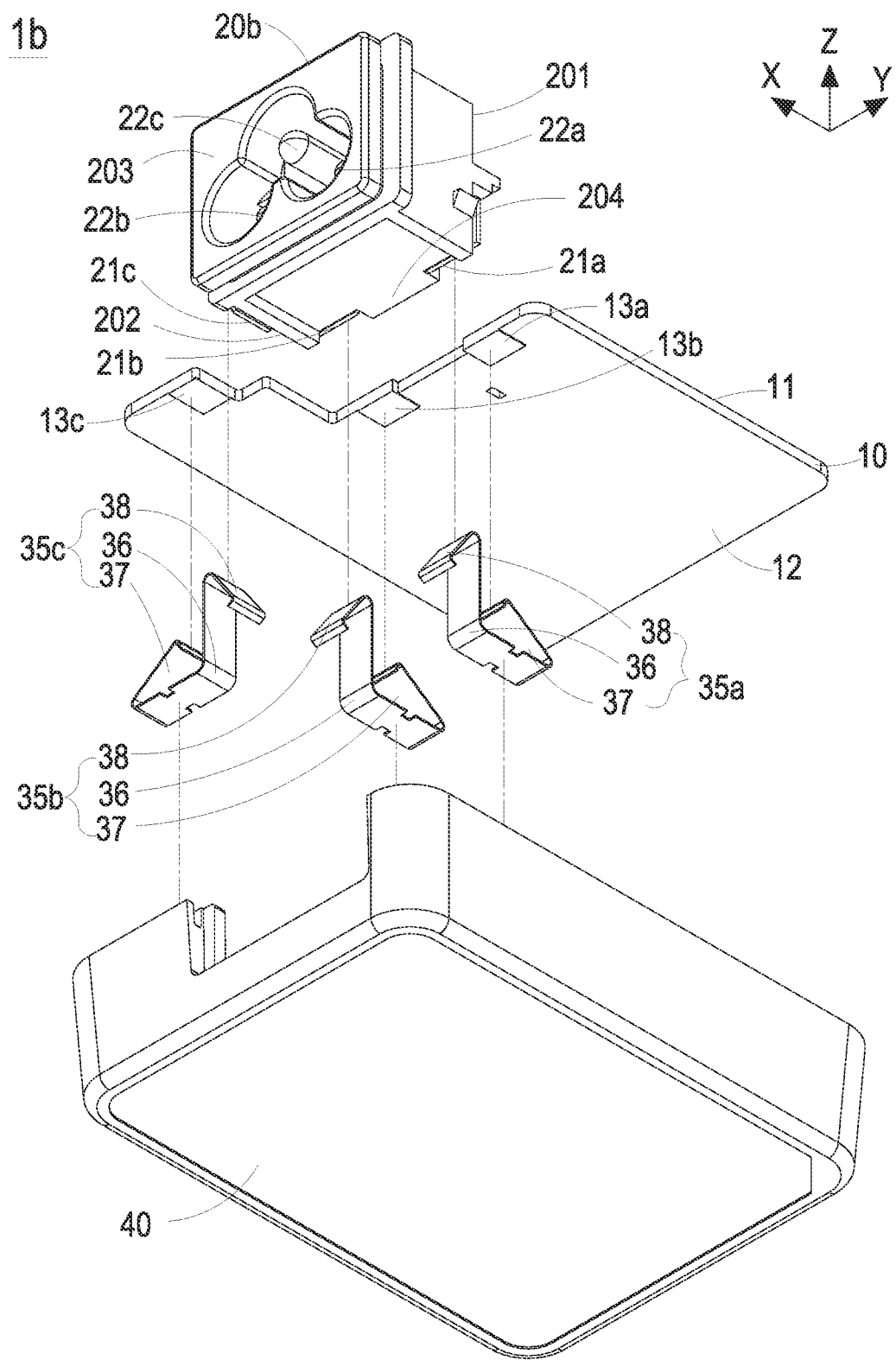
FIG. 18 is an exploded view illustrating the power adapter assembly structure according to the third embodiment of the present disclosure.
Figure 19:
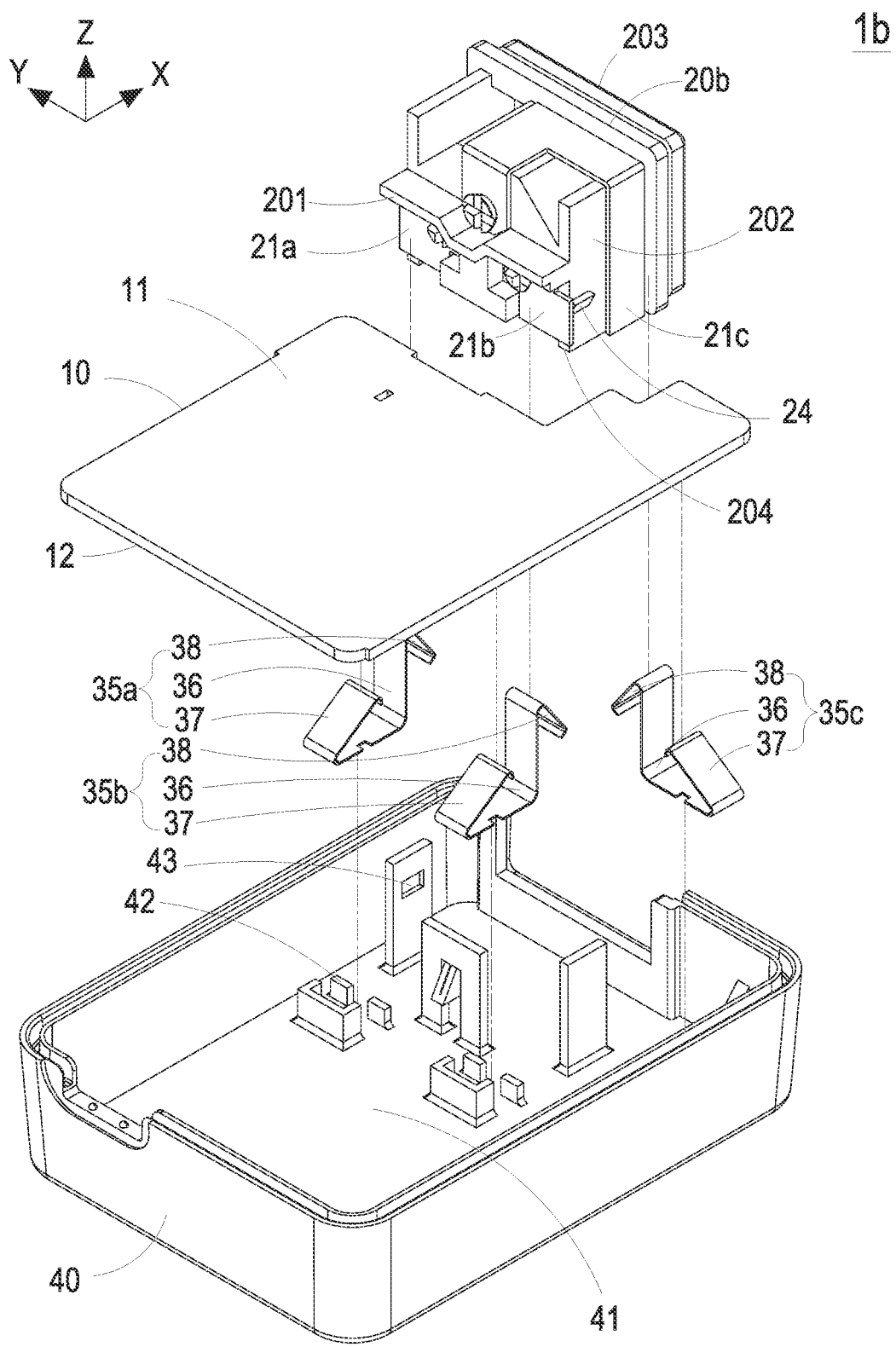
FIG. 19 is an exploded view illustrating the power adapter assembly structure according to the third embodiment of the present disclosure and taken from another perspective.
Figure 20:
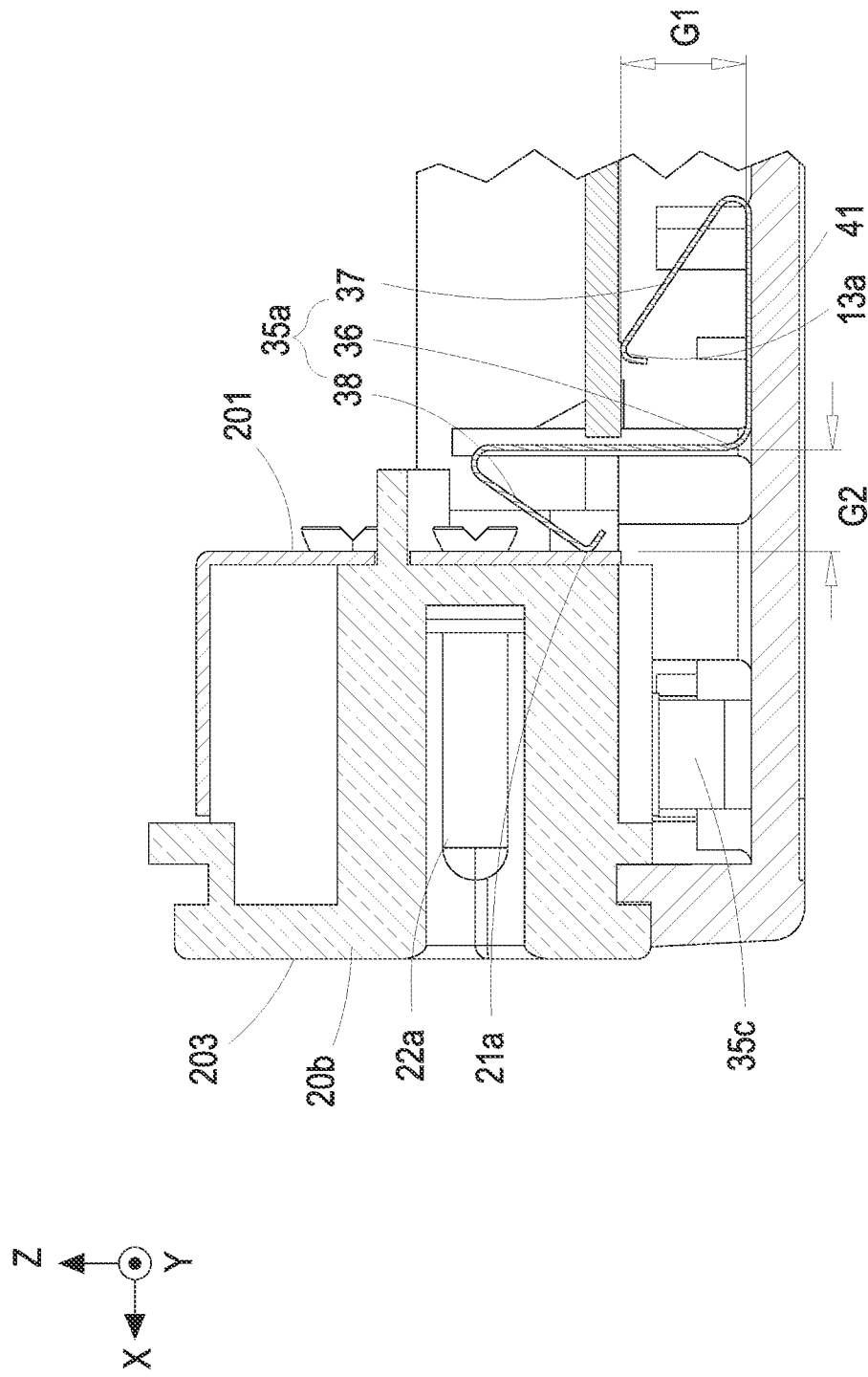
FIG. 20 is a vertical cross-sectional view illustrating the power adapter assembly structure according to the third embodiment of the present disclosure.
Figure 21:
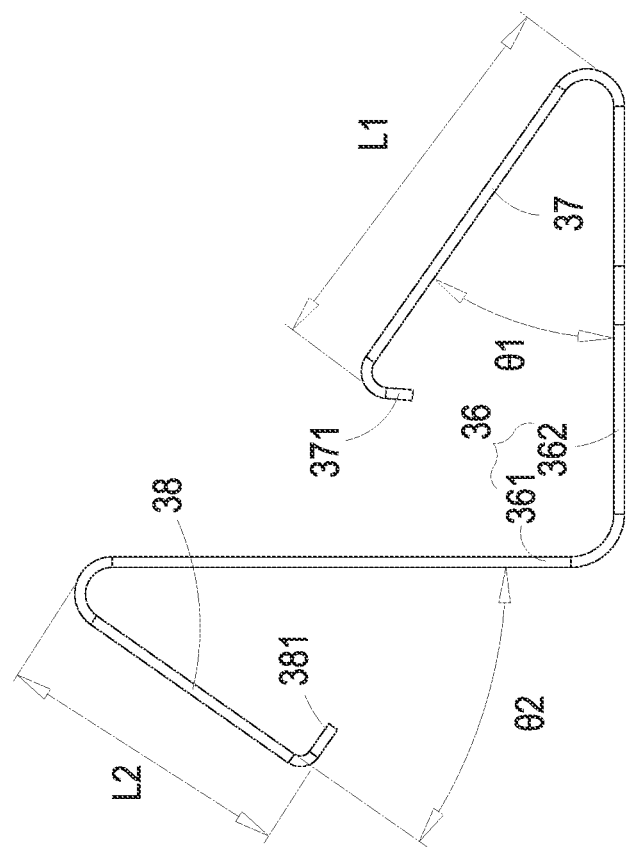
FIG. 21 is an exemplary structural view illustrating the elastic element of the power adapter assembly structure according to the third embodiment of the present disclosure.
Figure 22:
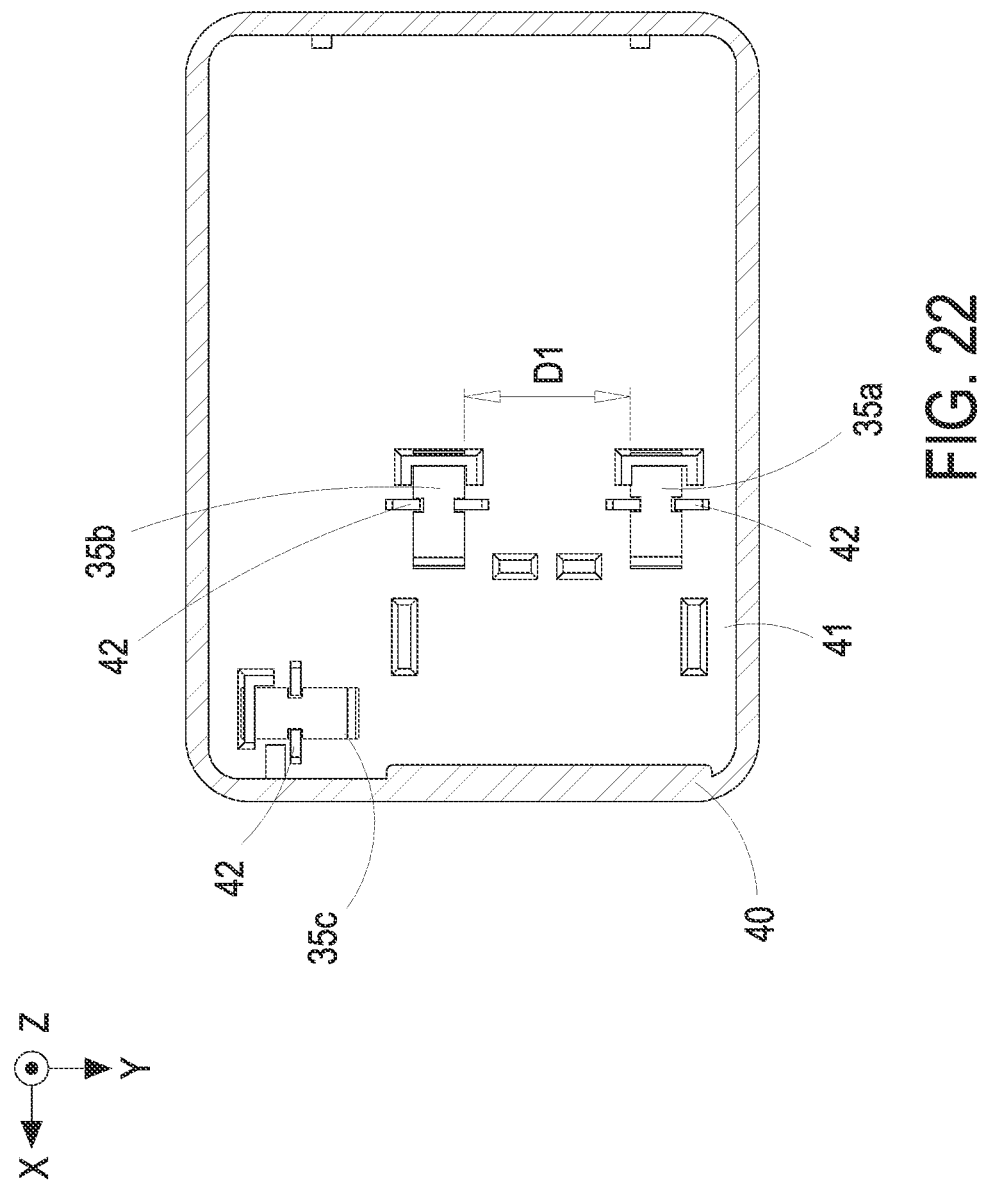
FIG. 22 is a horizontal cross-sectional view illustrating the power adapter assembly structure according to the third embodiment of the present disclosure.

FIGS. 16 and 17 are perspective views illustrating a power adapter assembly structure according to a third embodiment of the present disclosure. FIGS. 18 and 19 are exploded views illustrating the power adapter assembly structure according to the third embodiment of the present disclosure. FIG. 20 is a vertical cross-sectional view illustrating the power adapter assembly structure according to the third embodiment of the present disclosure. FIG. 21 is an exemplary structural view illustrating the elastic element of the power adapter assembly structure according to the third embodiment of the present disclosure. FIG. 22 is a horizontal cross-sectional view illustrating the power adapter assembly structure according to the third embodiment of the present disclosure. In the embodiment, the structures, elements and functions of the power adapter assembly structure 1*b* are similar to those of the power adapter assembly structure 1*a* of FIGS. 8 to 15, and are not redundantly described herein. In the embodiment, the power adapter assembly structure 1*b* includes a housing 40, a circuit board 10, a socket 20*b*, a first elastic element 35*a*, a second elastic element 35*b* and a third elastic element 35*c*. The housing 40 includes an installation surface 41 and three accommodation seats 42. The three accommodation seats 42 are disposed on the installation surface 41 and configured to fasten the first elastic element 35*a*, the second elastic element 35*b* and the third elastic element 35*c*. The circuit board 10 is fastened in the housing 40 and includes at least one first abutting surface. Preferably but not exclusively, the at least one first abutting surface includes a first live-wire abutting surface 13*a*, a first neutral-wire abutting surface 13*b* and a first earth-wire abutting surface 13*c*, which are disposed on the bottom surface 12 of the circuit board 10 and face the installation surface 41. In the embodiment, a first engaging element 24 of the socket 20*b* and a second engaging element 43 of the housing 40 are engaged with each other, so as to fix socket 20*b* to the housing 40, and the socket 20*b* is disposed adjacent to the circuit board 10. Preferably but not exclusively, a rear side 201 and a lateral side 202 of the socket 20*b* spatially correspond to the edge of the circuit board 10. In the embodiment, the socket 20*b* includes at least one second abutting surface. Preferably but not exclusively, the at least one second abutting surface includes a second live-wire abutting surface 21*a*, a second neutral-wire abutting surface 21*b* and a second earth-wire abutting surface 21*c*. The second live-wire abutting surface 21*a* and the second neutral-wire abutting surface 21*b* are located at the rear side 201 of the socket 20*b*, respectively, and the second earth-wire abutting surface 21*c* is located at the lateral side 202 of the socket 20*b*. The first elastic element 35*a*, the second elastic element 35*b* and the third elastic element 35*c* are connected between the circuit board 10 and the socket 20*b*, respectively. In the embodiment, the first elastic element 35*a*, the second elastic element 35*b* and the third elastic element 35*c* have the same or similar structure, and each of which includes a main body 36, a first hanging arm 37 and a second hanging arm 38. In the embodiment, the main body 36 further includes a fitting section 362 and a standing section 361. The fitting section 362 spatially corresponds to the corresponding first abutting surface, such as the first live-wire abutting surface 13*a*, the first neutral-wire abutting surface 13*b* and the earth-wire abutting surface 13*c*, and is attached to the installation surface 41. The standing section 361 spatially corresponds to the corresponding second abutting surface, such as the second live-wire abutting surface 21*a*, the second neutral-wire abutting surface 21*b* and the second earth-wire abutting surface 21*c*. In the embodiment, the fitting section 362 is connected to the standing section 361, the first hanging arm 37 and the standing section 361 are located at two opposite ends of the fitting section 362, and the second hanging arm 38 and the fitting section 362 are located at two opposite ends of the standing section 361.

In the embodiment, the second live-wire abutting surface 21a and the second neutral-wire abutting surface 21b are located at the rear side 201 of the socket 20b, and the second earth-wire abutting surface 21c is located at the lateral side 202 of the socket 20b. When the socket 20b is fixed to the housing 40, the standing section 361 of the main body 36 of the first elastic element 35a constantly abuts the second live-wire abutting surface 21a through the corresponding second hanging arm 38, the standing section 361 of the main body 36 of the second elastic element 35b constantly abuts the second neutral-wire abutting surface 21b through the corresponding second hanging arm 38, and the standing section 361 of the main body 36 of the third elastic element 35c constantly abuts the second earth-wire abutting surface 21c through the corresponding second hanging arm 38.

In the embodiment, the first hanging arm 37 of the first elastic element 35a spatially corresponds to and constantly abuts the first live-wire abutting surface 13a, and the second hanging arm 38 of the first elastic element 35a spatially corresponds to and constantly abuts the second live-wire abutting surface 21a. The first hanging arm 37 of the second elastic element 35b spatially corresponds to and constantly abuts the first neutral-wire abutting surface 13b, and the second hanging arm 38 of the second elastic element 35b spatially corresponds to and constantly abuts the second neutral-wire abutting surface 21b. The first hanging arm 37 of the third elastic element 35c spatially corresponds to and constantly abuts the first earth-wire abutting surface 13c, and the second hanging arm 38 of the third elastic element 35c spatially corresponds to and constantly abuts the second earth-wire abutting surface 21c. It should be noted that the corresponding relationships of the first elastic element 35a, the second elastic element 35b, and the third elastic element 35c connected between the circuit board 10 and the socket 20b are merely illustrative. Taking the first elastic element 35a as an example for illustration, a first gap G1 is formed between the fitting section 362 of the main body 36 of the first elastic element 35a and the corresponding first live-wire abutting surface 13a, and a second gap G2 is formed between the standing section 361 of the main body 36 of the first elastic element 35a and the corresponding second live-wire abutting surface 21a, as shown in FIG. 20. In addition, the first hanging arm 37 of the first elastic element 35a is extended from the fitting section 362 of the main body 36 to form a first length L1 of the first hanging arm 37, and the second hanging arm 38 of the first elastic element 35a is extended from the standing section 361 of main body 36 to form a second length L2 of the second hanging arm 38, as shown in FIG. 21. In the embodiment, the first gap G1 is less than the first length L1 of the first hanging arm 37, and the second gap G2 is less than the second length L2 of the second hanging arm 38. In that, when the socket 20b and the circuit board 10 are fixed to the housing 40, the first hanging arm 37 of the first elastic element 35a is pressed by the circuit board 10 to generate an elastic force against the corresponding first live-wire abutting surface 13a, and the second hanging arm 38 of the first elastic element 35a is pressed by the socket 20b to generate an elastic force against the corresponding second live-wire abutting surface 21a. The second elastic element 35b and the third elastic element 35c are also connected between the circuit board 10 and the socket 20b in the same manner.

Preferably but not exclusively, in the embodiment, each of the first elastic element 35a, the second elastic element 35b and the third elastic element 35c is integrally formed into one piece by a conductive metal sheet. The first elastic element 35a is connected between the first live-wire abutting surface 13a of the circuit board 10 and the second live-wire abutting surface 21a of the socket 20b. The second elastic element 35b is connected between the first neutral-wire abutting surface 13b of the circuit board 10 and the second neutral abutting surface 21b of the socket 20b. The third elastic element 35c is connected between the first earth-wire abutting surface 13c of the circuit board 10 and the second earth-wire abutting surface 21c of the socket 20b. Whereby, a stable electrical connection between the socket 20b and the circuit board 10 is achieved. The first elastic element 35a is taken as the example for illustration. When the circuit board 10 and the socket 20b are fixed to the housing 40, the first hanging arm 37 of the first elastic element 35a is pressed by the circuit board 10, and an elastic force is generated to constantly abut the corresponding first live-wire abutting surface 13a. Moreover, when the standing section 361 of the first elastic element 35a and the socket 20b are matched to each other, an elastic force is generated by the second hanging arm 38 of the first elastic element 35a to constantly abut the corresponding second live-wire abutting surface 21a. Therefore, the installation procedure of the first elastic element 35a, the second elastic element 35b and the third elastic element 35c is combined with the assembling procedure of the socket 20b and the circuit board 10, so as to realize the power adapter assembly structure 1b of the housing 40, the socket 20b, the circuit board 10, the first elastic element 35a, the second elastic element 35b and the third elastic element 35c by the automatic assembling equipment, and ensure the electrical connection between the socket 20b and the circuit board 10.

In the embodiment, taking the first elastic element 35a as the example for illustration, the first hanging arm 37 and the fitting section 362 of the main body 36 form a first included angle θ1, and the second hanging arm 38 and the standing section 361 of the main body 36 form a second included angle θ2. Preferably but not exclusively, the first included angle θ1 and the second included angle θ1 are an acute angle, respectively, ranged from 1° to 89°, so as to provide the elastic force and increase the structural strength. It is helpful to combine the assembling procedure of the socket 20b and the circuit board 10 to realize the power adapter assembly structure 1b. In the embodiment, the first hanging arm 37 of the first elastic element 35a further includes a first extension section 371, which is connected to the first hanging arm 37 and extended from the corresponding first live-wire abutting surface 13a toward the main body 36, so as to facilitate the first hanging arm 37 to firmly abut against the first live-wire abutting surface 13a and increase the structural strength of the first elastic element 35a. Similarly, the second hanging arm 38 of the first elastic element 35a further includes a second extension section 381, which is connected to the second hanging arm 38 and extended from the corresponding second live-wire abutting surface 21a toward the main body 36, so as to facilitate the second hanging arm 38 to firmly abut against the second live-wire abutting surface 21a and increase the structural strength of the first elastic element 35a. Certainly, the present disclosure is not limited thereto.

In the embodiment, each of the fitting sections 362 has a recess engaged with the corresponding accommodation seat 42, so that the first elastic element 35a, the second elastic element 35b, and the third elastic element 35c are pre-set on the installation surface 41 of the housing 40, respectively. When the circuit board 10 and the socket 20b are fixed to the housing 40, the first live-wire abutting surface 13a, the first neutral-wire abutting surface 13b and the first earth-wire abutting surface 13c of the circuit board 10 push the first hanging arms 37 of the first elastic element 35a, the second elastic element 35b and the third elastic element 35c, respectively, in the Z-axis direction, and the second live-wire abutting surface 21a, the second neutral-wire abutting surface 21b and the second earth-wire abutting surface 21c of the socket 20b push the second hanging arms 38 of the first elastic element 35a, the second elastic element 35b and the third elastic element 35c, respectively, so as to complete the assembling procedure of the power adapter assembly structure 1b. Since the electrical connection between the socket 20b and the circuit board 10 is achieved through the first elastic element 35a, the second elastic element 35b and the third elastic element 35c with structural strength, combined with the assembling procedure of the socket 20b and the circuit board 10 on the housing 40, it is more helpful to realize the power adapter assembly structure 1b of the housing 40, the socket 20b, the circuit board 10, the first elastic element 35a, the second elastic element 35b and the third elastic element 35c by an automated production method. The assembling procedure is simplified, the production cost is reduced, and the competitiveness of the product is enhanced.

In summary, the present disclosure provides a power adapter assembly structure. By utilizing the elastic element to connect the socket and the circuit board, the assembling procedure is simplified, the automated production is realized, and the EMI/RFI caused by the crossed leading wires is avoided at the same time. With one-piece formed elastic element disposed on an installation surface of the housing, when the socket and the circuit board are fastened on the housing, the two hanging arms of the elastic element constantly abut the abutting surfaces of the socket and the circuit board, respectively, so that a stable electronical connection of the socket and the circuit board are achieved. When the elastic element is pressed against the corresponding abutting surface constantly through the hanging arm thereof, the included angle between the hanging arm and the main body is for example an acute angle, so as to provide the elastic force and increase the structural strength. Since the hanging arms of the elastic element are pressed to constantly abut the corresponding abutting surfaces by the elastic force generated during fastening the socket and the circuit board to the housing, the assembling procedure of the socket, the circuit board and the housing is combined to realize the assembly structure of the housing, the socket, the circuit board and the elastic element by the automatic assembling equipment, and ensure the electrical connection between the socket and the circuit board. The elastic elements are configured to form the electrical connections between the socket and the circuit board, which are for example connected to the live wire, the neutral wire and the earth wire. Two elastic elements connected to the live wire and the neutral wire are led out from the rear side of the socket and arranged in parallel, so as to ensure that the minimum distance maintained between the two elastic elements meets the safety requirements for electrical clearance and creepage distance. In addition, the elastic element connected to the earth wire is led out from the lateral side of the socket to further ensure that the three elastic elements meet the safety requirements of electrical clearance and creepage distance. It avoids electrical EMI/RFI interference caused by crossed wires. On the other hand, since the electrical connections between the socket and the circuit board are realized through the elastic elements with structural strength, and integrated with the assembling procedure of the socket and the circuit board, it is more helpful to realize the assembly structure of the socket, the circuit board and the elastic elements by an automated production method. The assembling procedure is simplified, the production cost is reduced, and the competitiveness of the product is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power adapter assembly structure, comprising:
a housing comprising an installation surface;
a circuit board fastened in the housing and comprising at least one first abutting surface facing the installation surface;
a socket fastened in the housing, disposed adjacent to the circuit board, and comprising at least one second abutting surface; and
at least one elastic element disposed on the installation surface, connected between the circuit board and the socket, and comprising a main body, a first hanging arm and a second hanging arm, wherein the first hanging arm and the second hanging arm are disposed at two opposite ends of the main body, the first hanging arm spatially corresponds to and constantly abuts the at least one first abutting surface, and the second hanging arm spatially corresponds to and constantly abuts the at least one second abutting surface, wherein a first gap is formed between the main body and the at least one first abutting surface, and the first gap is less than a first length of the first hanging arm extended from the main body, wherein a second gap is formed between the main body and the at least one second abutting surface, and the second gap is less than a second length of the second hanging arm extended from the main body.

2. The power adapter assembly structure according to claim 1, wherein the at least one first abutting surface comprises a first live-wire abutting surface and a first neutral-wire abutting surface located on a bottom surface of the circuit board, the at least one second abutting surface comprises a second live-wire abutting surface and a second neutral-wire abutting surface located on a bottom side of the socket, and the at least one elastic element comprises a first elastic element and a second elastic element, wherein the first hanging arm of the first elastic element constantly abuts against the first live-wire abutting surface, the first hanging arm of the second elastic element constantly abuts the first neutral-wire abutting surface, the second hanging arm of the first elastic element constantly abuts the second live-wire abutting surface, and the second hanging arm of the second elastic element constantly abuts against the second neutral-wire abutting surface.

3. The power adapter assembly structure according to claim 2, wherein the main body of the first elastic element and the main body of the second elastic element are attached to the installation surface, respectively.

4. The power adapter assembly structure according to claim 2, wherein the first elastic element and the second elastic element are arranged parallel to each other.

5. The power adapter assembly structure according to claim 2, wherein the first live-wire abutting surface and the first neutral-wire abutting surface are located adjacent to a rear side of the socket, respectively.

6. The power adapter assembly structure according to claim 2, wherein the at least one first abutting surface further comprises a first earth-wire abutting surface located on the bottom surface of the circuit board, the at least one second abutting surface further comprises a second earth-wire abutting surface located on the bottom side of the socket, and the at least one elastic element further comprises a third elastic element, wherein the first hanging arm of the third elastic element constantly abuts against the first earth-wire abutting surface, and the second hanging arm of the third elastic element constantly abuts against the second earth-wire abutting surface.

7. The power adapter assembly structure according to claim 6, wherein the first live-wire abutting surface and the first neutral-wire abutting surface are located adjacent to a rear side of the socket, respectively, and the first earth-wire abutting surface is located adjacent to a lateral side of the socket.

8. The power adapter assembly structure according to claim 6, wherein each of the second live-wire abutting surface, the second neutral-wire abutting surface and the second earth-wire abutting surface is formed by a conductive metal sheet extended from a rear side of the socket to the bottom side, wherein the socket further comprises three conductive pins extended from the rear side to a front side opposite to the rear side, and the second live-wire abutting surface, the second neutral-wire abutting surface and the second earth-wire abutting surface are electrically connected to the three conductive pins, respectively.

9. The power adapter assembly structure according to claim 1, wherein the main body comprises a fitting section and a standing section, the fitting section spatially corresponds to the at least one first abutting surface and is attached to the installation surface, and the standing section spatially corresponds to the at least one second abutting surface, wherein the fitting section is connected to the standing section, the first hanging arm and the standing section are located at two opposite ends of the fitting section, and the second hanging arm and the fitting section are located at two opposite ends of the standing section.

10. The power adapter assembly structure according to claim 9, wherein the at least one first abutting surface comprises a first live-wire abutting surface and a first neutral-wire abutting surface located on a bottom surface of the circuit board, the at least one second abutting surface comprises a second live-wire abutting surface and a second neutral-wire abutting surface located on a rear side of the socket, and the at least one elastic element comprises a first elastic element and a second elastic element, wherein the first hanging arm of the first elastic element constantly abuts against the first live-wire abutting surface, the first hanging arm of the second elastic element constantly abuts the first neutral-wire abutting surface, the second hanging arm of the first elastic element constantly abuts the second live-wire abutting surface, and the second hanging arm of the second elastic element constantly abuts against the second neutral-wire abutting surface.

11. The power adapter assembly structure according to claim 10, wherein the socket further comprises a first receiving slot and a second receiving slot disposed on the rear side of the socket, wherein the second live-wire abutting surface, and the second hanging arm and the standing section of the main body of the first elastic element are partially received within the first receiving slot, wherein the second neutral-wire abutting surface, and the second hanging arm and the standing section of the main body of the second elastic element are partially received within the second receiving slot.

12. The power adapter assembly structure according to claim 10, wherein the first elastic element and the second elastic element are arranged parallel to each other.

13. The power adapter assembly structure according to claim 10, wherein the first live-wire abutting surface and the first neutral-wire abutting surface are located adjacent to the rear side of the socket, respectively.

14. The power adapter assembly structure according to claim 10, wherein the at least one first abutting surface further comprises a first earth-wire abutting surface located on the bottom surface of the circuit board, the at least one second abutting surface further comprises a second earth-wire abutting surface located on the bottom side of the socket, and the at least one elastic element further comprises a third elastic element, wherein the first hanging arm of the third elastic element constantly abuts against the first earth-wire abutting surface, and the second hanging arm of the third elastic element constantly abuts against the second earth-wire abutting surface.

15. The power adapter assembly structure according to claim 14, wherein the first live-wire abutting surface and the first neutral-wire abutting surface are located adjacent to the rear side of the socket, respectively, and the first earth-wire abutting surface is located adjacent to a lateral side of the socket.

16. The power adapter assembly structure according to claim 14, wherein each of the second live-wire abutting surface, the second neutral-wire abutting surface and the second earth-wire abutting surface is formed by a conductive metal sheet extended from a rear side of the socket to the bottom side, wherein the socket further comprises three conductive pins extended from the rear side to a front side opposite to the rear side, and the second live-wire abutting surface, the second neutral-wire abutting surface and the second earth-wire abutting surface are electrically connected to the three conductive pins, respectively.

17. The power adapter assembly structure according to claim 1, wherein the first hanging arm and the main body form a first included angle, the second hanging arm and the main body form a second included angle, and each of the first included angle and the second included angle is an acute angle, respectively.

18. The power adapter assembly structure according to claim 1, wherein the first hanging arm further comprises a first extension section extended from the corresponding one of the at least first abutting surface toward the main body, and the second hanging arm further comprises a second extension section extended from the corresponding one of the at least second abutting surface toward the main body.

19. The power adapter assembly structure according to claim 1, wherein the first hanging arm and the second hanging arm are in a wavy bent shape.

\* \* \* \* \*